US012532615B2

(12) United States Patent
Song et al.

(10) Patent No.: US 12,532,615 B2
(45) Date of Patent: Jan. 20, 2026

(54) DISPLAY APPARATUS INCLUDING VERTICAL AND HORIZONTAL POWER LINES ON DIFFERENT LAYERS

(71) Applicant: Samsung Display Co., Ltd., Yongin-si (KR)

(72) Inventors: Heerim Song, Yongin-si (KR); Heejean Park, Yongin-si (KR); Yujin Lee, Yongin-si (KR); Cheolgon Lee, Yongin-si (KR); Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 610 days.

(21) Appl. No.: 17/742,983

(22) Filed: May 12, 2022

(65) Prior Publication Data

US 2023/0122296 A1    Apr. 20, 2023

(30) Foreign Application Priority Data

Oct. 18, 2021    (KR) .......................... 10-2021-0138839

(51) Int. Cl.
*H10K 59/13*    (2023.01)
*H10K 59/126*    (2023.01)
(Continued)

(52) U.S. Cl.
CPC ......... *H10K 59/131* (2023.02); *H10K 59/126* (2023.02); *H10K 59/12* (2023.02); *H10K 59/122* (2023.02)

(58) Field of Classification Search
CPC ............... H10K 59/131; H10K 59/126; H10K 59/1213; H10K 59/1216; H10K 59/124; H10K 59/30; H10K 59/12; H10K 59/122
See application file for complete search history.

(56) References Cited

U.S. PATENT DOCUMENTS 8,823,609 B2    9/2014  Chung
9,741,287 B2    8/2017  Na et al.
(Continued)

FOREIGN PATENT DOCUMENTS

KR    10-1030003    4/2011
KR    10-1084169    11/2011
(Continued)

*Primary Examiner* — Ida M Soward
(74) *Attorney, Agent, or Firm* — Sughrue Mion, PLLC

(57) ABSTRACT

A display apparatus includes a first sub-pixel including a first pixel electrode; a second sub-pixel including a second pixel electrode; a $1^{st}$-$1^{st}$ vertical power line extending in a first direction passing through the first sub-pixel; a $1^{st}$-$2^{nd}$ vertical power line extending in the first direction passing through the second sub-pixel; a first horizontal power line, the first horizontal power line, and the $1^{st}$-$1^{st}$ vertical power line and the $1^{st}$-$2^{nd}$ vertical power line being disposed on different layers, extending in a second direction intersecting the first direction, and electrically connected to the $1^{st}$-$1^{st}$ vertical power line and the $1^{st}$-$2^{nd}$ vertical power line; and an opposite electrode disposed above the first pixel electrode and the second pixel electrode, being integral as a single body over the first sub-pixel and the second sub-pixel, and electrically connected to the $1^{st}$-$1^{st}$ vertical power line and the $1^{st}$-$2^{nd}$ vertical power line.

22 Claims, 21 Drawing Sheets

(51) Int. Cl.
   *H10K 59/131*   (2023.01)
   *H10K 59/12*    (2023.01)
   *H10K 59/122*   (2023.01)

(56) References Cited

U.S. PATENT DOCUMENTS

| | | | |
|---|---|---|---|
| 9,933,678 B1* | 4/2018 | Chen | G02F 1/136286 |
| 10,192,935 B2* | 1/2019 | Shim | H10K 59/1213 |
| 10,705,389 B2* | 7/2020 | Xian | H10D 86/441 |
| 10,936,132 B2 | 3/2021 | Jang | |
| 11,004,394 B2* | 5/2021 | Omata | G09G 3/32 |
| 11,158,263 B2 | 10/2021 | Choi et al. | |
| 11,177,291 B2 | 11/2021 | Osawa et al. | |
| 11,201,204 B2 | 12/2021 | Jo et al. | |
| 11,380,664 B2* | 7/2022 | Lee | H10D 86/441 |
| 11,557,642 B2* | 1/2023 | Lee | H10K 59/131 |
| 12,284,880 B2* | 4/2025 | Lee | H10K 59/122 |
| 2014/0124754 A1* | 5/2014 | Park | G09G 3/3233 |
| | | | 257/40 |
| 2015/0102303 A1* | 4/2015 | Kim | H10K 59/1213 |
| | | | 257/40 |
| 2019/0139994 A1* | 5/2019 | Park | H10D 86/443 |
| 2019/0267440 A1* | 8/2019 | Park | H10K 59/1216 |
| 2020/0105849 A1 | 4/2020 | Kim et al. | |
| 2020/0273397 A1* | 8/2020 | Jeong | G09G 3/32 |
| 2020/0302840 A1* | 9/2020 | Kim | G09G 3/006 |
| 2021/0020725 A1* | 1/2021 | Park | H10K 59/121 |
| 2022/0005405 A1* | 1/2022 | Aoki | G09G 3/32 |
| 2022/0052032 A1* | 2/2022 | Li | H01L 21/467 |
| 2023/0120823 A1* | 4/2023 | Lee | H10D 86/481 |
| | | | 438/4 |

FOREIGN PATENT DOCUMENTS

| | | | | |
|---|---|---|---|---|
| KR | 10-1794856 | 11/2017 | | |
| KR | 20180024314 A | * 3/2018 | | H10K 59/351 |
| KR | 10-2018-0089928 | 8/2018 | | |
| KR | 10-2019-0128801 | 11/2019 | | |
| KR | 20190128801 A | * 11/2019 | | H10K 59/131 |
| KR | 10-2020-0037027 | 4/2020 | | |
| KR | 10-2020-0071188 | 6/2020 | | |
| KR | 10-2156781 | 9/2020 | | |

* cited by examiner

DISPLAY APPARATUS INCLUDING VERTICAL AND HORIZONTAL POWER LINES ON DIFFERENT LAYERS

CROSS-REFERENCE TO RELATED APPLICATION(S)

This application claims priority to and benefits of Korean Patent Application No. 10-2021-0138839 under 35 U.S.C. § 119, filed on Oct. 18, 2021, in the Korean Intellectual Property Office, the entire contents of which are incorporated herein by reference.

BACKGROUND

1. Technical Field

One or more embodiments relate to a display apparatus, and to a display apparatus that displays high-quality images.

2. Description of the Related Art

In general, in a display apparatus such as an organic light-emitting display apparatus, thin-film transistors, connection electrodes, and wires may be arranged in each sub-pixel to control the luminance of each sub-pixel.

However, such a display apparatus has a problem in that the quality of an implemented image may be low.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus capable of displaying high-quality images. However, this is an example, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus may include a first sub-pixel including a first pixel electrode; a second sub-pixel including a second pixel electrode; a $1^{st}$-$1^{st}$ vertical power line extending in a first direction passing through the first sub-pixel; a $1^{st}$-$2^{nd}$ vertical power line extending in the first direction passing through the second sub-pixel; a first horizontal power line, the first horizontal power line, and the $1^{st}$-$1^{st}$ vertical power line and the $1^{st}$-$2^{nd}$ vertical power line being disposed on different layers, the first horizontal power line extending in a second direction intersecting the first direction, the first horizontal power line electrically connected to the $1^{st}$-$1^{st}$ vertical power line and the $1^{st}$-$2^{nd}$ vertical power line; and an opposite electrode disposed above the first pixel electrode and the second pixel electrode, being integral as a single body over the first sub-pixel and the second sub-pixel, and electrically connected to the $1^{st}$-$1^{st}$ vertical power line and the $1^{st}$-$2^{nd}$ vertical power line.

The opposite electrode may be electrically connected to the $1^{st}$-$1^{st}$ vertical power line and the $1^{st}$-$2^{nd}$ vertical power line, outside of a display area including the first sub-pixel and the second sub-pixel.

The $1^{st}$-$1^{st}$ vertical power line and the $1^{st}$-$2^{nd}$ vertical power line may be disposed on an insulating layer covering the first horizontal power line.

The $1^{st}$-$1^{st}$ vertical power line may be electrically connected to the first horizontal power line through a contact hole in the first sub-pixel, and the $1^{st}$-$2^{nd}$ vertical power line may be electrically connected to the first horizontal power line through a contact hole in the second sub-pixel.

The first horizontal power line may include a first lower horizontal power line extending in the second direction; and a first upper horizontal power line disposed above the first lower horizontal power line and electrically connected to the first lower horizontal power line.

The display apparatus may further include a semiconductor layer disposed on an insulating layer covering the first lower horizontal power line, wherein the first upper horizontal power line may be disposed on an insulating layer covering the semiconductor layer.

The semiconductor layer may include an oxide semiconductor material.

The semiconductor layer may be an n-type semiconductor layer.

The display apparatus may further include a second vertical power line disposed outside of the first sub-pixel and the second sub-pixel and extending in the first direction; and a second horizontal power line extending in the second direction and passing through the first sub-pixel and the second sub-pixel and electrically connected to the second vertical power line.

The second horizontal power line may be electrically connected to a transistor included in the first sub-pixel and a transistor included in the second sub-pixel.

The second vertical power line, the $1^{st}$-$1^{st}$ vertical power line, and the $1^{st}$-$2^{nd}$ vertical power line may be disposed on a same layer.

The first horizontal power line may include a first lower horizontal power line extending in the second direction; and a first upper horizontal power line disposed above the first lower horizontal power line and electrically connected to the first lower horizontal power line, and the second horizontal power and the first upper horizontal power line may be disposed on a same layer.

The display apparatus may further include a semiconductor layer including an oxide semiconductor material, the semiconductor layer being disposed on an insulating layer covering the first lower horizontal power line, wherein the second horizontal power line and the first upper horizontal power line may be disposed on an insulating layer covering the semiconductor layer.

The first horizontal power line may include a first lower horizontal power line extending in the second direction; and a first upper horizontal power line disposed above the first lower horizontal power line and electrically connected to the first lower horizontal power line, and the second horizontal power line and the first lower horizontal power line may be disposed on a same layer.

The display apparatus may further include a semiconductor layer including an oxide semiconductor material, the semiconductor layer being disposed on an insulating layer covering the second horizontal power line and the first lower horizontal power line, wherein the first upper horizontal power line may be disposed on an insulating layer covering the semiconductor layer.

The second horizontal power line, a lower capacitor electrode disposed in the first sub-pixel, and a lower capacitor electrode disposed in the second sub-pixel may be integral with each other as a single body.

The display apparatus may further include a semiconductor layer including an oxide semiconductor material, the semiconductor layer being disposed on an insulating layer covering the second horizontal power line and the first lower horizontal power line; and upper capacitor electrodes disposed on an insulating layer covering the semiconductor layer, the upper capacitor electrodes overlapping a lower capacitor electrode in a plan view disposed in the first sub-pixel and a lower capacitor electrode disposed in the second sub-pixel, and the first upper horizontal power line may be disposed on an insulating layer covering the upper capacitor electrodes.

The display apparatus may further include a semiconductor layer including an oxide semiconductor material, the semiconductor layer being disposed on an insulating layer covering the second horizontal power line and the first lower horizontal power line; upper capacitor electrodes disposed on an insulating layer covering the semiconductor layer, the upper capacitor electrodes overlapping a lower capacitor electrode in a plan view disposed in the first sub-pixel and a lower capacitor electrode disposed in the second sub-pixel; and additional capacitor electrodes overlapping the upper capacitor electrodes in a plan view, and being disposed on an insulating layer covering the upper capacitor electrodes, wherein the first upper horizontal power line may be disposed on an insulating layer covering the additional capacitor electrodes.

The display apparatus may further include a first shield layer and a second shield layer, the first shield layer, the second shield layer, and the first upper horizontal power line being disposed on a same layer, the first shield layer being disposed in the first sub-pixel and the second shield layer being disposed in the second sub-pixel, wherein the $1^{st}$-$1^{st}$ vertical power line, the $1^{st}$-$2^{nd}$ vertical power line, and the second vertical power line may be disposed on an insulating layer covering the first shield layer and the second shield layer, and the $1^{st}$-$1^{st}$ vertical power line may be electrically connected to the first shield layer through a contact hole and the $1^{st}$-$2^{nd}$ vertical power line may be electrically connected to the second shield layer through a contact hole.

The display apparatus may further include a first upper capacitor electrode disposed in the first sub-pixel and a second upper capacitor electrode disposed in the second sub-pixel; a first additional capacitor electrode and a second additional capacitor electrode disposed on an insulating layer covering the first upper capacitor and the second upper capacitor electrode, the first additional capacitor electrode overlapping the first upper capacitor electrode in a plan view, the second additional capacitor electrode overlapping the second upper capacitor electrode in a plan view; and a first data line extending in the first direction and passing through the first sub-pixel; and a second data line extending in the first direction and passing through the second sub-pixel, wherein the first shield layer and the second shield layer may be disposed on an insulating layer covering the first additional capacitor electrode and the second additional capacitor electrode, the first data line and the second data line may be disposed on an insulating layer covering the first shield layer and the second shield layer, the first shield layer may be disposed between the first additional capacitor electrode and the first data line, and the second shield layer may be disposed between the second additional capacitor electrode and the second data line.

According to one or more embodiments, a display apparatus may include a substrate including a display area including an edge extending in a first direction and an edge extending in a second direction; a lower write signal line extending in the second direction intersecting the display area; an upper write signal line disposed above the lower write signal line, extending in the second direction, and electrically connected to the lower write signal line; and a semiconductor layer including a switching active area overlapping at least one of the lower write signal line and the upper write signal line in a plan view.

The display apparatus may further include a data line extending in the first direction intersecting the display area and electrically connected to a side of the switching active area of the semiconductor layer.

The semiconductor layer may be disposed on an insulating layer covering the lower write signal line.

The switching active area of the semiconductor layer may overlap the lower write signal line in a plan view.

The lower write signal line may have a protrusion, and the switching active area of the semiconductor layer may overlap the protrusion in a plan view.

The semiconductor layer may include an oxide semiconductor material.

The semiconductor layer may be an n-type semiconductor layer.

The display apparatus may further include a second vertical power line extending in the first direction intersecting the display area; a first horizontal power line, the first horizontal power line and the second vertical power line being disposed on different layers, the first horizontal power line extending in the second direction intersecting the display area, and electrically connected to the second vertical power line; and an opposite electrode electrically connected to the second vertical power line and being integral as a single body over sub-pixels.

The opposite electrode may be electrically connected to the second vertical power line outside of the display area.

The second vertical power line may be disposed on an insulating layer covering the first horizontal power line.

The first horizontal power line may include a first lower horizontal power line extending in the second direction; and a first upper horizontal power line disposed above the first lower horizontal power line and electrically connected to the first lower horizontal power line.

The first lower horizontal power line and the lower write signal line may be disposed on a same layer.

The first upper horizontal power line and the upper write signal line may be disposed on a same layer.

The display apparatus may further include a semiconductor layer disposed on an insulating layer covering the first lower horizontal power line, wherein the first upper horizontal power line may be disposed on an insulating layer covering the semiconductor layer.

The display apparatus may further include a first vertical power line extending in the first direction intersecting the display area; and a second horizontal power line, the second horizontal power line and the second vertical power line being disposed on different layers, the second horizontal power line extending in the second direction intersecting the display area, and electrically connected to the second vertical power line.

The semiconductor layer may include an operation control active area of an operation control transistor, and the second horizontal power line may be electrically connected to a side of the operation control active area through a contact hole.

The second horizontal power line and the upper write signal line may be disposed on a same layer.

The first vertical power line may be disposed on an insulating layer covering the second horizontal power line.

The display apparatus may further include a data line extending in the first direction intersecting the display area, and electrically connected to a side of the switching active area of the semiconductor layer, wherein the data line and the first vertical line may be disposed on a same layer.

The display apparatus may further include a capacitor electrode, wherein the second horizontal power line may be disposed on an insulating layer covering the capacitor electrode and may have a protrusion between the capacitor electrode and the data line.

A length of the display area in the second direction may be greater than a length in the first direction.

The first direction may be a vertical direction and the second direction may be a horizontal direction.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
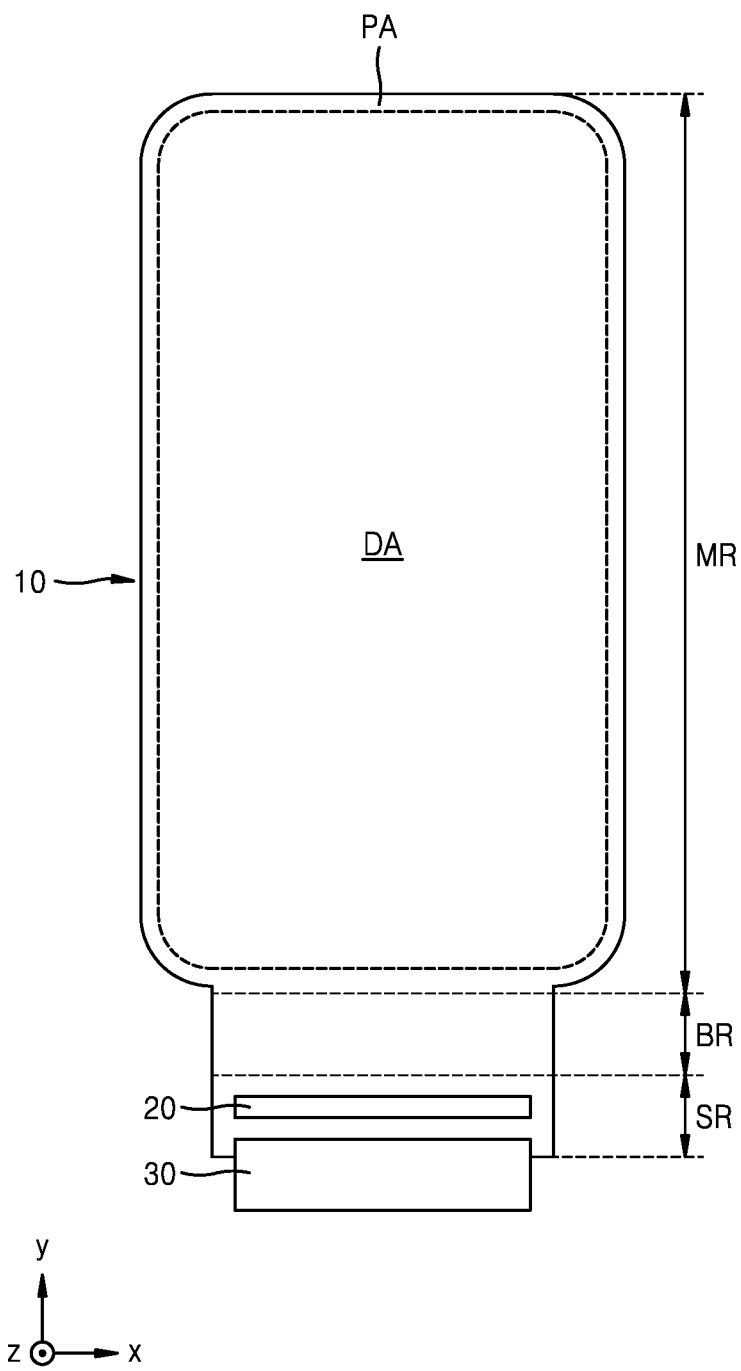
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b or c" indicates only a, only b, only c, both a and b, both a and c, both b and c, all of a, b, and c, or variations thereof.

Since the disclosure may have diverse modified embodiments, embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Reference will now be made in detail to embodiments, examples of which are illustrated in the accompanying drawings, wherein like reference numerals refer to like elements throughout, and repeated description thereof may be omitted.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when a layer, region, or component is referred to as being "formed on" another layer, region, or component, it can be directly or indirectly formed on the other layer, region, or component. For example, intervening layers, regions, or components may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

Sizes of components in the drawings may be exaggerated for convenience of explanation. In other words, since sizes and thicknesses of components in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following embodiments, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

Figure 2:
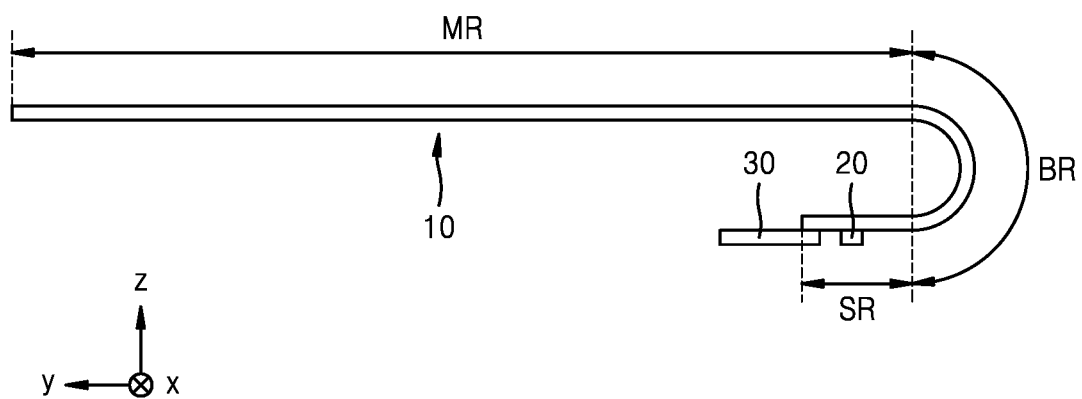
FIG. 2 is a schematic side view of the display apparatus of FIG. 1.

FIG. 1 is a schematic plan view of a display apparatus according to an embodiment, and FIG. 2 is a schematic side view of the display apparatus of FIG. 1. A portion of the display apparatus according to an embodiment may be bent as shown in FIG. 2. However, in FIG. 1, it is illustrated as not being bent for convenience.

As shown in FIGS. 1 and 2, the display apparatus according to an embodiment may include a display panel 10. Such a display apparatus may be any type as long as it may include the display panel 10. For example, the display apparatus may be a variety of products, such as a smartphone, tablet, laptop, television or billboard.

The display panel 10 may include a display area DA and a peripheral area PA outside the display area DA. The display area DA is a portion that displays an image, and pixels may be arranged (or disposed) in the display area DA. When viewed from a direction substantially perpendicular to the display panel 10, the display area DA may have various shapes, such as a circular shape, an elliptical shape, a polygonal shape, and another shape. FIG. 1 illustrates that the display area DA has a rectangular shape with rounded corners. It is to be understood that the shapes described herein may also include shapes substantial to the described shapes.

The peripheral area PA may be arranged outside of the display area DA. A width (in an x-axis direction) of a portion of the peripheral area PA may be less than a width (in the x-axis direction) of the display area DA. Through this structure, at least a portion of the peripheral area PA may be readily bent as will be described later.

However, because the display panel 10 may include a substrate 100 (see FIG. 11), it may be said that the substrate 100 has the display area DA and the peripheral area PA as described above. Hereinafter, for convenience, the substrate 100 will be described as having the display area DA and the peripheral area PA.

The display panel 10 may also include a main area MR, a bending area BR outside the main area MR, and a sub area SR located opposite to the main area MR with respect to the bending area BR. In the bending area BR, as shown in FIG. 2, the display panel 10 is bent so that at least a portion of the sub area SR overlaps the main area MR when viewed in a z-axis direction. The disclosure is not limited to a bent display apparatus, and may be applied to a non-bent display apparatus. The sub area SR may be a non-display area as described later. By bending the display panel 10 in the bending area BR, when the display apparatus is viewed from the front (in the −z direction), the non-display area may not be viewed, or the visible area may be minimized even if the non-display area is viewed.

A driving chip 20 may be arranged in the sub area SR of the display panel 10. The driving chip 20 may include an integrated circuit that drives the display panel 10. The integrated circuit may be a data driving integrated circuit that generates a data signal, but the disclosure is not limited thereto.

The driving chip 20 may be mounted on the sub area SR of the display panel 10. The driving chip 20 may be mounted on a same surface as a display surface of the display area DA, but as the display panel 10 is bent in the bending area BR as described above, the driving chip 20 may be disposed on a rear surface of the main area MR.

A printed circuit board 30 or the like may be attached to an end of the sub area SR of the display panel 10. The printed circuit board 30 and the like may be electrically connected to the driving chip 20 or the like through a pad (not shown) on the substrate.

Hereinafter, an organic light-emitting display apparatus will be described as an example of a display apparatus according to an embodiment, but the display apparatus of the disclosure is not limited thereto. In an embodiment, the display apparatus of the disclosure may be an inorganic light-emitting display apparatus (or inorganic EL display apparatus) or a display apparatus such as a quantum dot light-emitting display apparatus. For example, an emission layer of the display apparatus included in the display apparatus may include an organic material or an inorganic material. The display apparatus may include an emission layer and a quantum dot layer located on a path of light emitted from the emission layer.

As described above, the display panel 10 may include the substrate 100. Various components included in the display panel 10 may be disposed on the substrate 100. The substrate 100 may include glass, metal, or a polymer resin. As described above, in case that the display panel 10 is bent in the bending area BR, the substrate 100 needs to have a flexible or bendable characteristic. The substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multilayer structure including two layers including the polymer resin, and a barrier layer including an inorganic material (such as silicon oxide, silicon nitride, silicon oxynitride, etc.) between the two layers, and various modifications thereof may be made.

Pixels are located (or disposed) in the display area DA. Each of the pixels may include sub-pixels, and each of the sub-pixels may include a display apparatus such as an organic light-emitting diode OLED. A sub-pixel may emit, for example, red, green, blue, or white light.

The sub-pixel may be electrically connected to external circuits arranged in the peripheral area PA. A scan driving circuit, an operation control driving circuit, a terminal, a first power supply wire, and a second power supply wiring may be arranged in the peripheral area PA. The scan driving circuit may provide a scan signal to a pixel through a scan line. The operation control driving circuit may provide an operation control signal to the pixel through an operation control line. The terminal arranged in the peripheral area PA of the substrate 100 may be exposed without being covered or overlapped by an insulating layer to be electrically connected to the printed circuit board 30. The terminal of the printed circuit board 30 may be electrically connected to a terminal of the display panel 10.

The printed circuit board 30 transmits a signal or power from a controller (not shown) to the display panel 10. A control signal generated by the controller may be transmitted to each of driving circuits through the printed circuit board 30. The controller may provide a first power voltage ELVSS to the first power supply wiring and a second power voltage ELVDD to the second power supply wiring. The first power voltage ELVSS (or a common voltage) may be transmitted to an opposite electrode 230 (see FIG. 11) of a pixel connected to the first power supply wire. The first power supply wiring may have a loop shape with one side open or a side open, for example, a shape that partially surrounds the display area DA. The first power supply wiring may be electrically connected to first power lines (see 1110 in FIG. 5, 1510 in FIG. 9, and 1641 in FIG. 10) crossing or intersecting a display area, so that various portions within the first power supply wiring have a uniform potential. The second power voltage ELVDD may be transmitted to each sub-pixel through a second power line (see 1530 in FIGS. 9 and 1620 in FIG. 10) connected to a second power supply wire.

Figure 10:
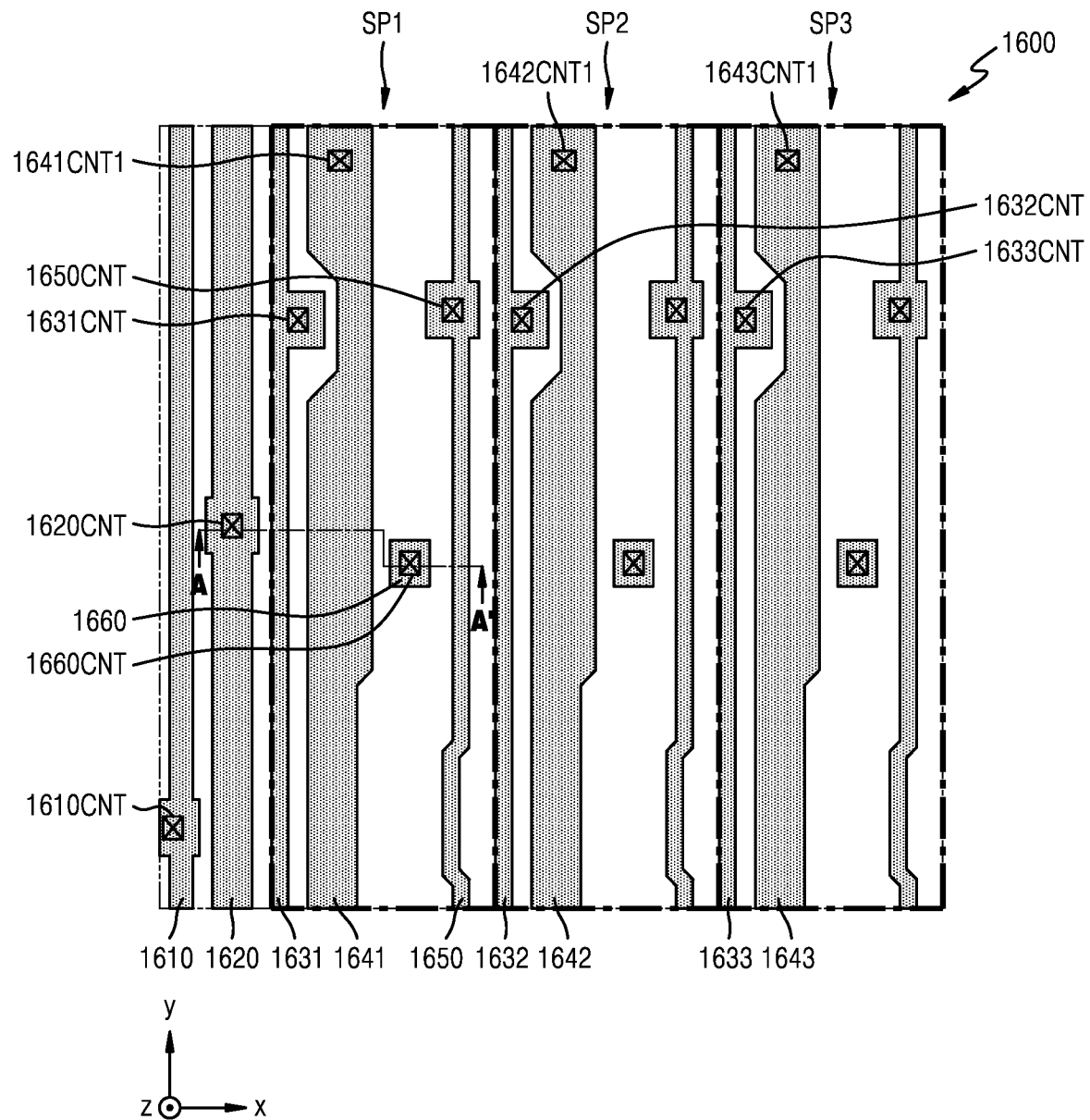

The controller may generate a data signal, and the generated data signal may be transmitted to a sub-pixel through the driving chip 20 and a data line (see 1631, 1632 and 1633 in FIG. 10).

For reference, the term "line" may be "wire". This also applies to the following embodiments and modifications thereof.

Figure 3:
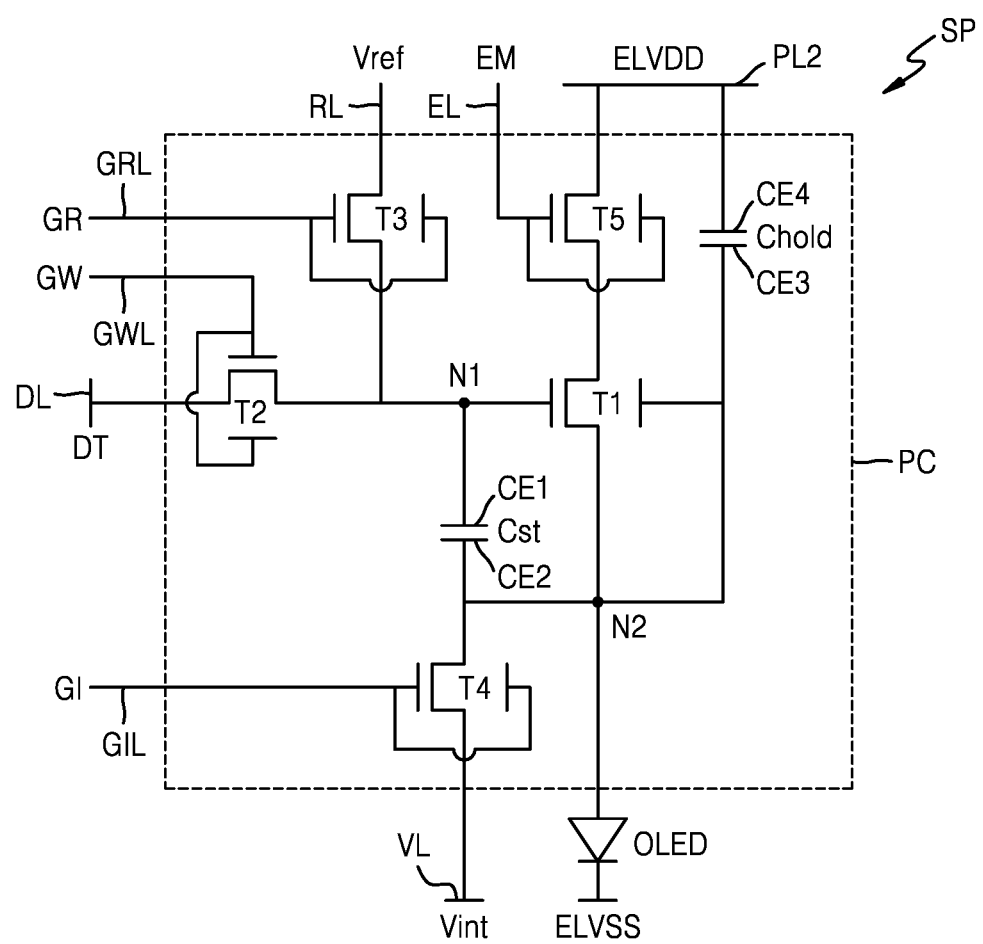
FIG. 3 is a schematic diagram of an equivalent circuit of a pixel included in the display apparatus of FIG. 1.

FIG. 3 a schematic diagram of an equivalent circuit of one sub-pixel SP included in the display apparatus of FIG. 1. As shown in FIG. 3, one sub-pixel SP may include a pixel circuit PC and the organic light-emitting diode OLED electrically connected thereto.

As shown in FIG. 3, the pixel circuit PC may include thin-film transistors T1 to T5, a storage capacitor Cst, and a holding capacitor Chold. The thin-film transistors T1 to T5, the storage capacitor Cst, and the holding capacitor Chold may be connected to signal lines GWL, GRL, GIL, EL, and DL, an initialization voltage line VL, a reference voltage line RL, and a second power line PL2.

The thin-film transistors T1 to T5 may include the driving transistor T1, the switching transistor T2, the reference voltage transistor T3, the initialization transistor T4, and the operation control transistor T5.

The organic light-emitting diode OLED may include a pixel electrode 210 (see FIG. 11) and an opposite electrode 230 (see FIG. 11), wherein the pixel electrode 210 of the organic light-emitting diode OLED may be connected to the driving transistor T1 to receive a driving current, and the opposite electrode 230 may receive the first power voltage ELVSS. The organic light-emitting diode OLED may generate light having a luminance corresponding to a driving current.

The thin-film transistors T1 to T5 may be n-channel MOSFETs (NMOSs). The thin-film transistors T1 to T5 may include an oxide semiconductor material.

The signal lines may include a write signal line GWL that transmits a write signal GW (a scan signal), a reference voltage signal line GRL that transmits a reference voltage signal GR, an initialization signal line GIL that transmits an initialization signal GI, an operation control signal line EL that transmits an operation control signal EM, and a data line DL that crosses the write signal line GWL and transmits a data signal DT.

The initialization voltage line VL may transmit an initialization voltage Vint initializing a pixel electrode of the organic light-emitting diode OLED, the reference voltage line RL may transmit a reference voltage Vref to a gate electrode of the driving transistor T1, and a second power line PL2 may transmit the second power voltage ELVDD that is a driving voltage to the driving transistor T1.

A driving gate electrode of the driving transistor T1 is connected to the storage capacitor Cst through a first node N1, a drain area of the driving transistor T1 is connected to the second power line PL2 through the operation control transistor T5, and a source area of the driving transistor T1 may be electrically connected to the pixel electrode 210 of the organic light-emitting diode OLED through a second node N2. The driving transistor T1 may receive the data signal DT according to a switching operation of the switching transistor T2 to supply a driving current to the organic light-emitting diode OLED. For example, the driving transistor T1 may control the amount of current flowing through the organic light-emitting diode OLED in response to a voltage applied to the first node N1 that is changed by a data signal Dm.

A switching gate electrode of the switching transistor T2 may be connected to the write signal line GWL transmitting the write signal GW, any one of a source area and a drain area of the switching transistor T2 may be connected to the data line DL, and the other of the source area and the drain area of the switching transistor T2 may be connected to the driving gate electrode of the driving transistor T1 through the first node N1. The switching transistor T2 may transmit the data signal Dm from the data line DL to the first node N1 in response to a voltage applied to the write signal line GWL. For example, the switching transistor T2 may be turned on according to the write signal GW received through the write signal line GWL, and may perform a switching operation of transmitting the data signal DT received from the data line DL to the driving transistor T1 through the first node N1.

A reference voltage gate electrode of the reference voltage transistor T3 may be connected to the reference voltage signal line GRL that transmits the reference voltage signal GR, any one of a source electrode and a drain electrode of the reference voltage transistor T3 may be connected to the reference voltage line RL, and the other of the source electrode and the drain electrode of the reference voltage transistor T3 may be connected to the driving gate electrode of the driving transistor T1 through the first node N1. The reference voltage transistor T3 may transmit the reference voltage Vref from the reference voltage line RL to the first node N1 in response to a voltage applied to the reference voltage signal line GRL. If necessary, the reference voltage signal line GRL may be the write signal line GWL in a sub-pixel belonging to a previous row adjacent to the sub-pixel SP shown in FIG. 3 and electrically connected to the same data line DL. The reference voltage signal GR may be referred to as a previous writing signal (a previous scan signal).

An initialization gate electrode of the initialization transistor T4 may be connected to the initialization signal line GIL, any one of a source area and a drain area of the initialization transistor T4 may be connected to the pixel electrode 210 of the organic light-emitting diode OLED through the second node N2, and the other of the source area and the drain area of the initialization transistor T4 may be connected to the initialization voltage line VL to receive the initialization voltage Vint. The initialization transistor T4 is turned on according to the initialization signal GI received through the initialization signal line GIL to initialize the pixel electrode 210 of the organic light-emitting diode OLED. If necessary, the initialization signal line GIL may be the write signal line GWL in a sub-pixel belonging to a next row adjacent to the sub-pixel SP shown in FIG. 3 and electrically connected to the same data line DL. The initialization signal GI may be referred to as a next writing signal (a subsequent scan signal).

An operation control gate electrode of the operation control transistor T5 may be connected to an operation control line EL, one of a source area and a drain area of the operation control transistor T5 may be connected to the second power line PL2, and the other may be connected to the drain area of the driving transistor T1. The operation control transistor T5 is turned on according to an operation control signal EM received through the operation control line EL so that the second power voltage ELVDD (driving voltage) is transmitted to the organic light-emitting diode OLED to allow a driving current to flow through the organic light-emitting diode OLED.

The storage capacitor Cst may include a first capacitor electrode CE1 and a second capacitor electrode CE2. The first capacitor electrode CE1 of the storage capacitor Cst is connected to the driving gate electrode of the driving transistor T1 through the first node N1, and the second capacitor electrode CE2 of the storage capacitor Cst is connected to the source area of the driving transistor T1 through the second node N2. The storage capacitor Cst may store a charge corresponding to a difference between the driving gate electrode voltage of the driving transistor T1 and the initialization voltage Vint.

The holding capacitor Chold may include a third capacitor electrode CE3 and a fourth capacitor electrode CE4. The third capacitor electrode CE3 of the holding capacitor Chold may be connected to the source area of the driving transistor T1 through the second node N2, and the fourth capacitor electrode CE4 of the holding capacitor Chold may be connected to the second power line PL2. A compensation voltage for compensating a threshold voltage Vth of the driving transistor T1 may be stored in the holding capacitor Chold.

A detailed operation of each sub-pixel SP according to an embodiment is as follows.

During an initialization period, in case that the initialization signal GI is supplied through the initialization signal line GIL, the initialization transistor T4 is turned on, and the pixel electrode 210 of the organic light-emitting diode OLED is initialized by the initialization voltage Vint supplied from the initialization voltage line VL. The source area of the driving transistor T1 electrically connected to the pixel electrode 210 of the organic light-emitting diode OLED by the second node N2 and the third capacitor electrode CE3 of the holding capacitor Chold are also initialized. As described above, the initialization signal line GIL may be the write signal line GWL in a sub-pixel belonging to a next row adjacent to the sub-pixel SP shown in FIG. 3 and electrically connected to the same data line DL. The initialization signal GI may be referred to as a next writing signal (a subsequent scan signal).

During the compensation period, in case that the reference voltage signal GR is supplied through the reference voltage signal line GRL, the reference voltage transistor T3 is turned on, and the reference voltage Vref supplied from the reference voltage line RL is transmitted to a gate electrode of the driving transistor T1 to compensate the threshold voltage Vth of the driving transistor T1. A compensation voltage for compensating the threshold voltage Vth of the driving transistor T1 is stored in the holding capacitor Chold. As described above, the reference voltage signal line GRL may be the write signal line GWL in a sub-pixel belonging to a previous row adjacent to the sub-pixel SP shown in FIG. 3 and electrically connected to the same data line DL. The reference voltage signal GR may be referred to as a previous writing signal (a previous scan signal).

During a data programming period, in case that the write signal GW is supplied through the write signal line GWL, the switching transistor T2 is turned on in response to the write signal GW. A voltage corresponding to the data signal DT supplied from the data line DL is applied to the driving gate electrode of the driving transistor T1. Because the first capacitor electrode CE1 of the storage capacitor Cst is connected to the driving gate electrode of the driving transistor T1 through the first node N1, and the second capacitor electrode CE2 of the storage capacitor Cst is connected to a third capacitor electrode of the holding capacitor Chold storing a compensation voltage for which the threshold voltage Vth of the driving transistor T1 is compensated through the second node N2, a data voltage for which the threshold voltage Vth of the driving transistor T1 is compensated is stored in the storage capacitor Cst.

During an emission period, the operation control transistor T5 is turned on by the operation control signal EM supplied from the operation control line EL. Because the first capacitor electrode CE1 of the storage capacitor Cst is connected to the driving gate electrode of the driving transistor T1 through the first node N1, and the second capacitor electrode CE2 of the storage capacitor Cst is connected to the source area of the driving transistor T1 through the second node N2, by the data voltage for which the threshold voltage Vth of the driving transistor T1 stored in the storage capacitor Cst is compensated, a driving current corresponding to the data signal DT flows through the organic light-emitting diode OLED regardless of the threshold voltage Vth of the driving transistor T1.

As described above, the thin-film transistors T1 to T5 may include an oxide semiconductor material. Because an oxide semiconductor has high carrier mobility and a low leakage current, a voltage drop is not great even if a driving time is long. For example, in a case of the oxide semiconductor, even in case that driving at a low frequency, a color change of an image according to a voltage drop is not large, so that driving at a low frequency is possible. Accordingly, by making the thin-film transistors T1 to T5 include an oxide semiconductor material, a display apparatus with reduced power consumption while preventing leakage current may be implemented.

Such an oxide semiconductor is sensitive to light, and variations in the amount of current and the like may occur due to light from the outside. Accordingly, it may be considered to absorb or reflect light from the outside by placing a metal layer below the oxide semiconductor. Accordingly, as shown in FIG. 3, each of the switching transistor T2, the reference voltage transistor T3, the initialization transistor T4, and the operation control transistor T5 including an oxide semiconductor layer may have gate electrodes above and below the oxide semiconductor layer. In the case of the driving transistor T1, the metal layer may be below the oxide semiconductor layer. For example, when viewed from a direction perpendicular to an upper surface of the substrate 100 (the z-axis direction), the metal layer below the oxide semiconductor may overlap the oxide semiconductor.

Figure 4:
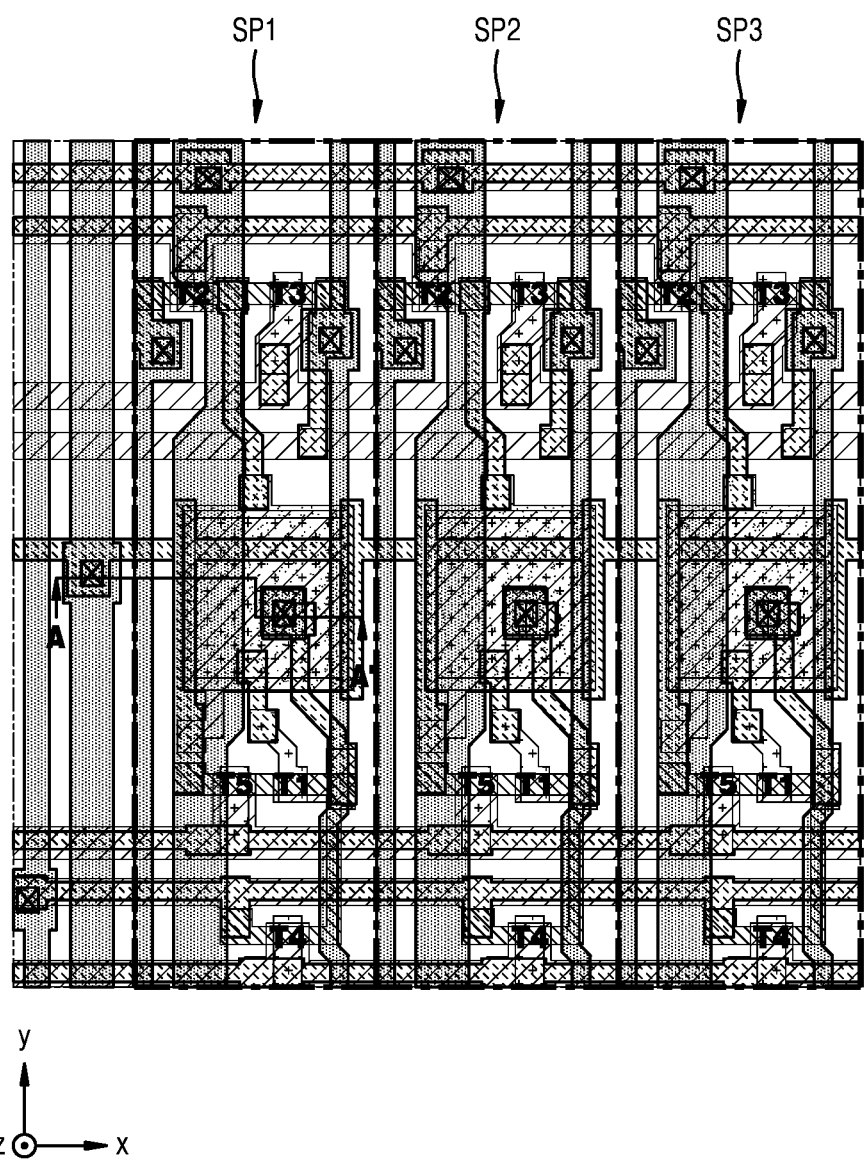
FIG. 4 is a schematic plan view schematically illustrating positions of transistors and capacitors in pixels included in the display apparatus of FIG. 1.
Figure 11:
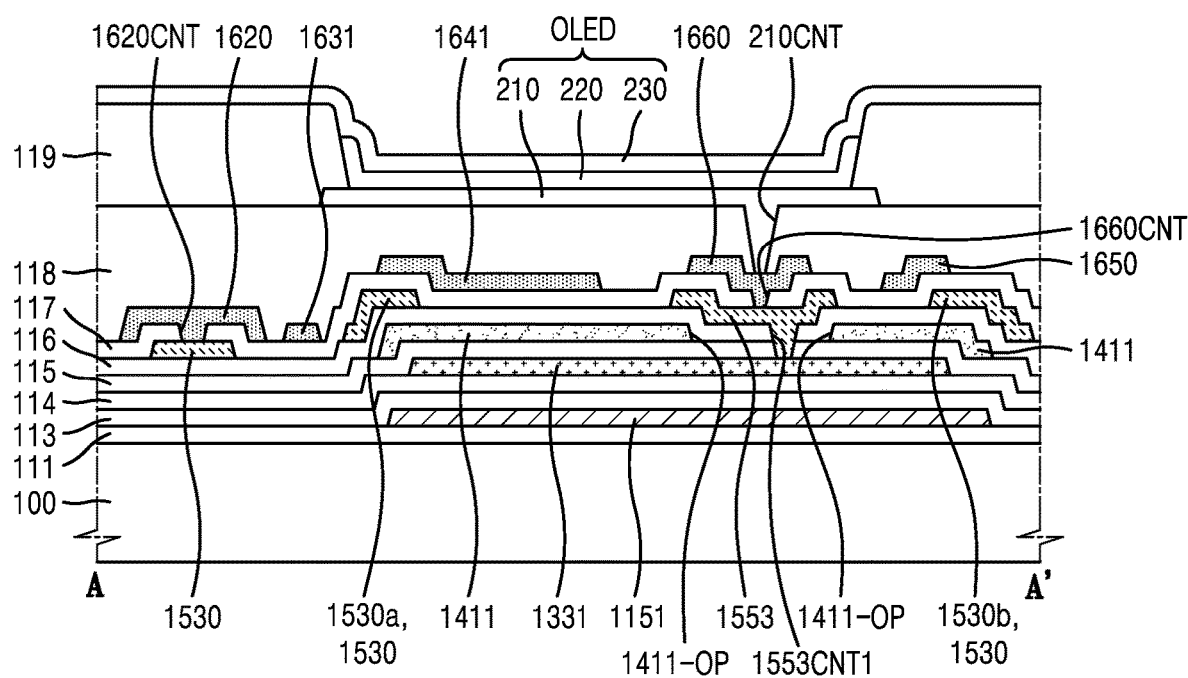
FIG. 11 is a schematic cross-sectional view schematically illustrating a cross-section taken along line A-A' of the display apparatus shown in FIG. 4.

FIG. 4 is a schematic plan view schematically illustrating positions of the thin-film transistors T1 to T5, the storage capacitor Cst, and the holding capacitor Chold in pixels included in the display apparatus of FIG. 1, FIGS. 5 to 10 are schematic plan views schematically illustrating components such as the thin-film transistors T1 to T5, the storage capacitor Cst, and the holding capacitor Chold of the display apparatus shown in FIG. 4 for each layer, and FIG. 11 is a schematic cross-sectional view schematically illustrating a cross-section taken along line A-A' of the display apparatus shown in FIG. 4.

As shown in FIGS. 4 to 10, the display apparatus may include pixels, and each of the pixels may include a first sub-pixel SP1, a second sub-pixel SP2, and a third sub-pixel SP3. For example, the first sub-pixel SP1 may be a red sub-pixel emitting red light, the second sub-pixel SP2 may be a green sub-pixel emitting green light, and the third sub-pixel SP3 may be a blue sub-pixel emitting blue light. However, the disclosure is not limited thereto, and one pixel may include a smaller number of sub-pixels or a larger number of sub-pixels.

The structures shown in FIGS. 4 to 10 may be repeatedly arranged in the first direction (a y-axis direction). However, the structures shown in FIGS. 4 to 10 may be repeatedly arranged in a second direction (x-axis direction) crossing or intersecting the first direction. An area not belonging to any one sub-pixel may exist between pixels. For example, in FIG. 10, a vertical initialization voltage line 1610 and a second vertical power line 1620 are illustrated to exist between pixels adjacent to each other in the second direction (x-axis direction).

Each of the first to third sub-pixels SP1 to SP3 may include a pixel circuit. Hereinafter, for convenience of explanation, some or a number of components will be described with reference to the pixel circuit of the first sub-pixel SP1, but these components may also be arranged in the pixel circuit of each of the second sub-pixel SP2 and the third sub-pixel SP3.

A buffer layer 111 (see FIG. 11) including silicon oxide, silicon nitride, or silicon oxynitride may be disposed on the substrate 100. The first buffer layer 111 may planarize the upper surface of the substrate 100.

Figure 5:
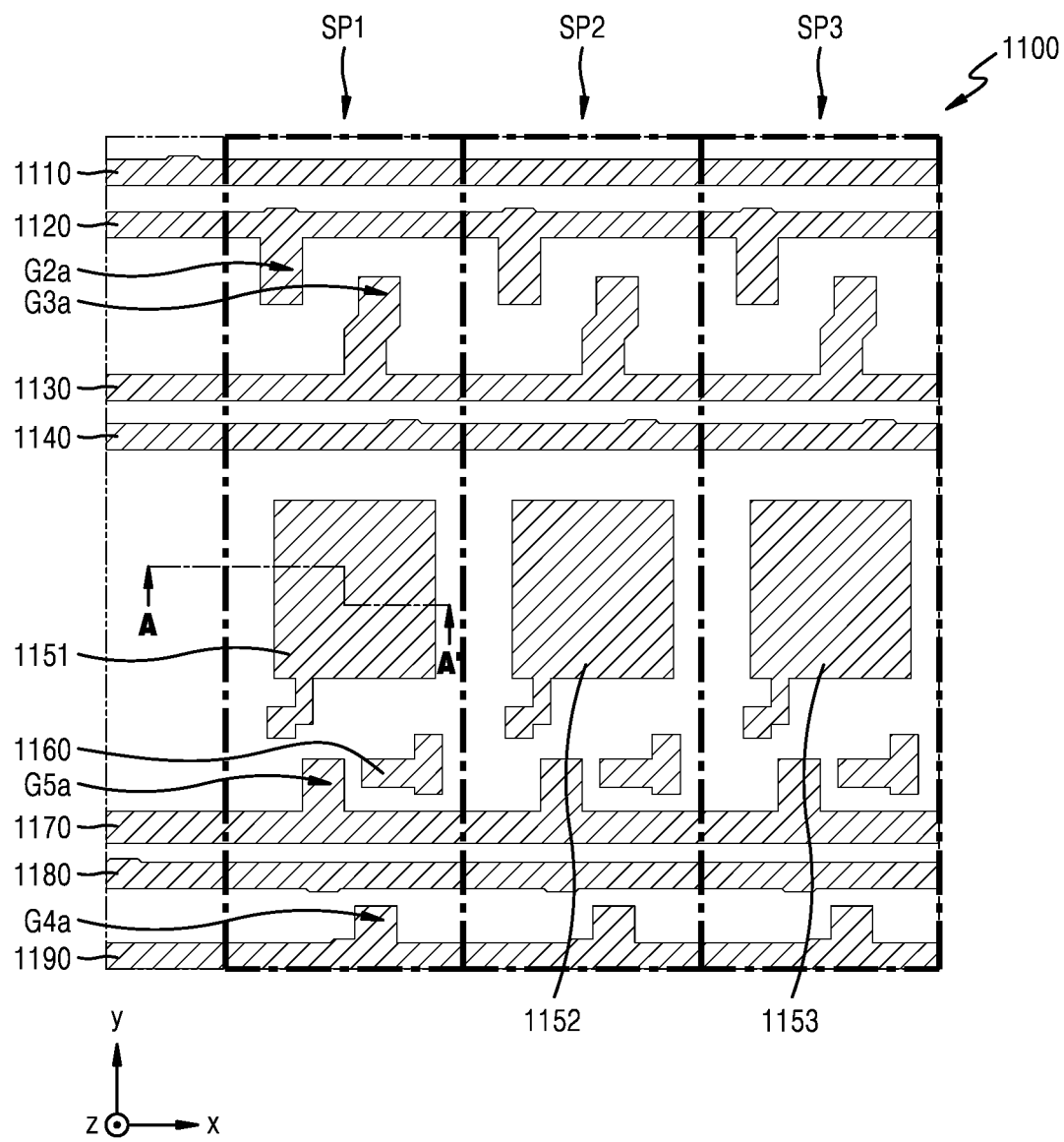
FIGS. 5 to 10 are schematic plan views schematically illustrating components, such as transistors and capacitors, of the display apparatus shown in FIG. 4, for each layer.

A lower metal layer 1100 as shown in FIG. 5 may be on the first buffer layer 111. The lower metal layer 1100 may include a first lower horizontal power line 1110, a lower write signal line 1120, a reference voltage signal line 1130, a horizontal reference voltage line 1140, a lower operation control signal line 1170, a lower initialization voltage line 1180, a lower initialization signal line 1190, a fourth capacitor electrode 1151, and a driving shield layer 1160. Among them, the first lower horizontal power line 1110, the lower write signal line 1120, the reference voltage signal line 1130, the horizontal reference voltage line 1140, the lower operation control signal line 1170, the lower initialization voltage line 1180, and the lower initialization signal line 1190 may extend in the second direction (x-axis direction).

The first lower horizontal power line 1110 may be electrically connected to the first upper horizontal power line 1510 (see FIG. 9) to be described later, through a contact hole 1510CNT (see FIG. 9). The first upper horizontal power line 1510 may be disposed above the first lower horizontal power line 1110 and extend in the second direction (x-axis direction). The first lower horizontal power line 1110 and the first upper horizontal power line 1510 may be components of a first horizontal power line.

The lower write signal line 1120 may be electrically connected to an upper write signal line 1520 (see FIG. 9) to be described later, through a contact hole 1520CNT2 (see FIG. 9). The upper write signal line 1520 may be disposed above the lower write signal line 1120 and extend in the second direction (x-axis direction). A set of the lower write signal line 1120 and the upper write signal line 1520 may correspond to the write signal line GWL of FIG. 3. A portion of the lower write signal line 1120 overlapping a semiconductor layer 1200 (see FIG. 6), to be described later, may be a lower switching gate electrode G2a of the switching transistor T2. In FIG. 5, the lower write signal line 1120 has a protrusion, and this protrusion is shown as the lower switching gate electrode G2a.

The reference voltage signal line 1130 may correspond to the reference voltage signal line GRL of FIG. 3. A portion of the reference voltage signal line 1130 overlapping the semiconductor layer 1200 may be a lower reference voltage gate electrode G3a of the reference voltage transistor T3. In FIG. 5, the reference voltage signal line 1130 has a protrusion, and the protrusion is illustrated as the lower reference voltage gate electrode G3a.

The horizontal reference voltage line 1140 may correspond to the reference voltage line RL of FIG. 3 together with a vertical reference voltage line 1650 to be described later.

The lower write signal line 1170 may be electrically connected to an upper operation control signal line 1570 (see FIG. 9) to be described later, through a contact hole 1570CNT1 (see FIG. 9). The upper operation control signal line 1570 may be disposed above the lower write signal line 1170 and extend in the second direction (x-axis direction). A set of the lower operation control signal line 1170 and the upper operation control signal line 1570 may correspond to the operation control signal line EL of FIG. 3. A portion of the lower operation control signal line 1170 overlapping the semiconductor layer 1200, to be described later, may be a lower operation control gate electrode G5a of the operation control transistor T5. In FIG. 5, the lower operation control signal line 1170 has a protrusion, and this protrusion is illustrated as the lower operation control gate electrode G5a.

The lower initialization voltage line 1180 may be electrically connected to an upper initialization voltage line 1580 (see FIG. 9) to be described later, through a contact hole 1580CNT1. The upper initialization voltage line 1580 may be located above the lower initialization voltage line 1180 and extend in the second direction (x-axis direction). The lower initialization voltage line 1180 and the upper initialization voltage line 1580 may correspond to the initialization voltage line VL of FIG. 3 together with the vertical initialization voltage line 1610 (refer to FIG. 10) to be described later.

The lower initialization signal line 1190 may be electrically connected to an upper initialization signal line 1590 (see FIG. 9) to be described later, through a contact hole 1590CNT1 (see FIG. 9). The upper initialization signal line 1590 may be disposed above the lower initialization signal line 1190 and extend in the second direction (x-axis direction). A set of the lower initialization signal line 1190 and the upper initialization signal line 1590 may correspond to the initialization signal line GIL of FIG. 3. A portion of the lower initialization signal line 1190 overlapping the semiconductor layer 1200, which will be described later, may be a lower initialization gate electrode G4a of the initialization transistor T4. In FIG. 5, the lower initialization signal line 1190 has a protrusion, and the protrusion is illustrated as the lower initialization gate electrode G4a.

The fourth capacitor electrode 1151 may have an isolated shape. The fourth capacitor electrode 1151 is the fourth capacitor electrode CE4 of the holding capacitor Chold of FIG. 3. The fourth capacitor electrode 1151 may be electrically connected to the second horizontal power line 1530 (see FIG. 9) disposed thereon through a contact hole 1530CNT1. FIG. 5 shows that the fourth capacitor electrode 1151 has a protrusion protruding in a direction of the lower operation control signal line 1170, and is electrically connected to the second horizontal power line 1530 thereon through the contact hole 1530CNT1 at the corresponding protrusion.

The driving shield layer 1160 may have an isolated shape like the fourth capacitor electrode 1151. The driving shield layer 1160 may overlap the driving gate electrode G1 (see FIG. 7) and a driving active area A1 (see FIG. 6) to be described later, thereby preventing or minimizing the incident of light from the outside into the driving active area A1. The driving shield layer 1160 is electrically connected to a third capacitor electrode 1331 (see FIG. 7) through a connection electrode 1553 (see FIG. 9) to be described later. Accordingly, because a compensation voltage for compensating the threshold voltage Vth of the driving transistor T1 stored in the holding capacitor Chold is applied to the driving shield layer 1160, the driving shield layer 1160 may protect the driving active area A1 from an unintentional electrical signal from the outside.

Figure 6:
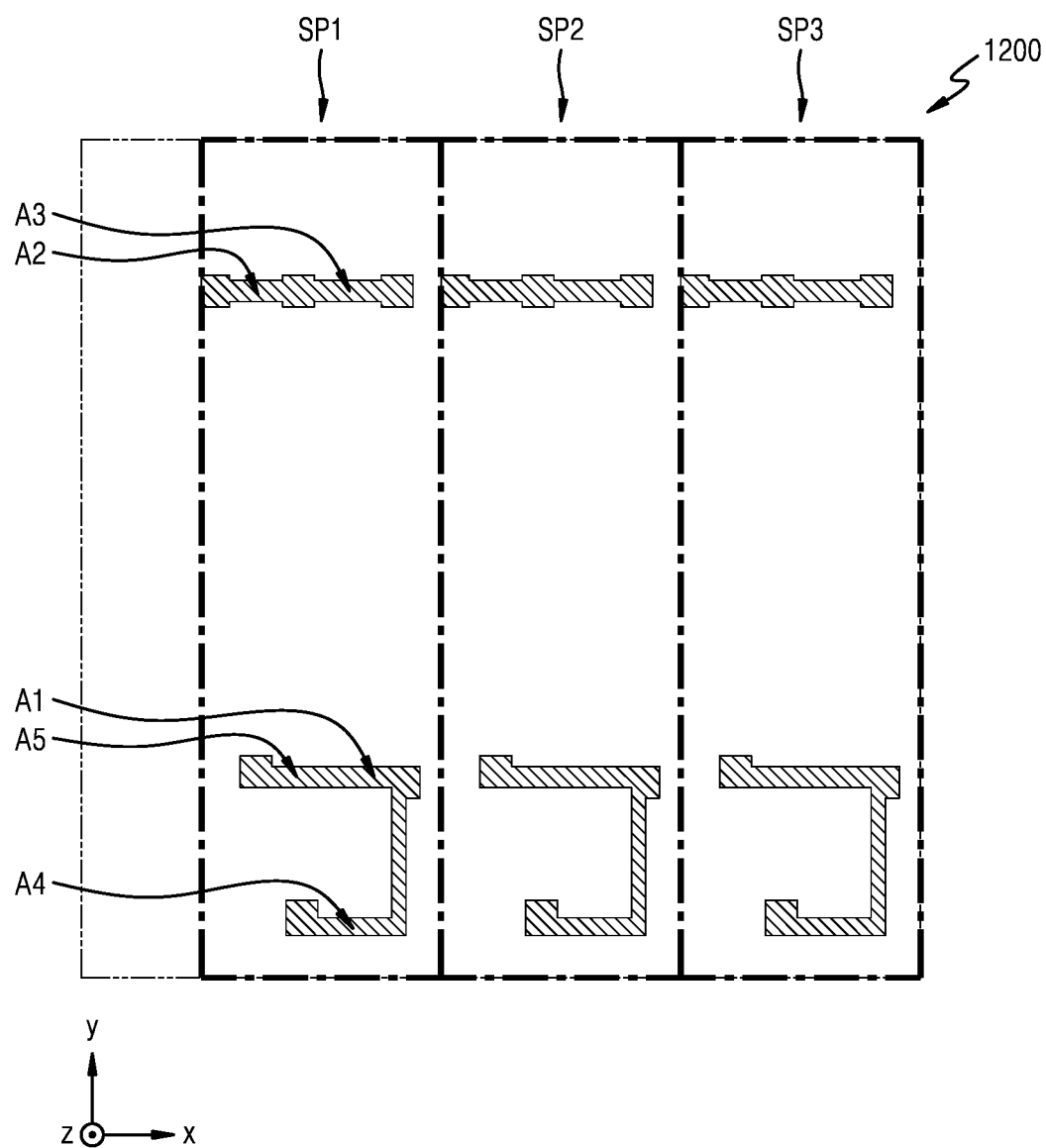

The lower switching gate electrode G2a, the lower reference voltage gate electrode G3a, the lower initialization gate electrode G4a, and the lower operation control gate electrode G5a may also overlap a switching active area A2, a reference voltage active area A3, an initialization active area A4, and an operation control active area A5 disposed thereon as shown in FIG. 6, thereby preventing or minimizing the incident of light from the outside onto the active areas.

The lower metal layer 1100 may include a metal, an alloy, or a conductive metal oxide. For example, the lower metal layer 1100 may include silver (Ag), alloy containing Ag, molybdenum (Mo), alloy containing Mo, aluminum (Al), alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), or scandium (Sc). The lower metal layer 1100 may have a multilayer structure. For example, the lower metal layer 1100 may have a two-layer structure including an aluminum layer having a thickness of about 3500 Å and a titanium layer having a thickness of about 300 Å.

A second buffer layer 113 (see FIG. 11) covers or overlaps the lower metal layer 1100 and may be disposed on the substrate 100. The second buffer layer 113 may include an insulating material. For example, the second buffer layer 113 may include silicon oxide, silicon nitride, or silicon oxynitride. The second buffer layer 113 may prevent diffusion of metal atoms or impurities from the substrate 100 to the semiconductor layer 1200 thereon.

The semiconductor layer 1200 as shown in FIG. 6 may be disposed on the second buffer layer 113. As described above, the semiconductor layer 1200 may include an oxide semiconductor material. For example, the semiconductor layer 1200 may include ITGZO having a thickness of about 300 Å. The driving transistor T1, the switching transistor T2, the reference voltage transistor T3, the initialization transistor T4, and the operation control transistor T5 are located along the semiconductor layer 1200 as shown in FIG. 6. In FIG. 6, the semiconductor layer 1200 may include a first portion and a second portion apart from each other, and the switching active area A2 of the switching transistor T2 and the reference voltage active area A3 of the reference voltage transistor T3 are located in the first portion, and the driving active area A1 of the driving transistor T1, the initialization active area A4 of the initialization transistor T4, and the operation control active area A5 of the operation control transistor T5 are located in the second portion.

A first gate insulating layer 114 (see FIG. 11) may cover or overlap the semiconductor layer 1200 and may be disposed on the substrate 100. The first gate insulating layer 114 may include an insulating material. For example, the first gate insulating layer 114 may include an inorganic insulating layer such as silicon oxide, silicon nitride, silicon oxynitride, or aluminum oxide.

Figure 7:
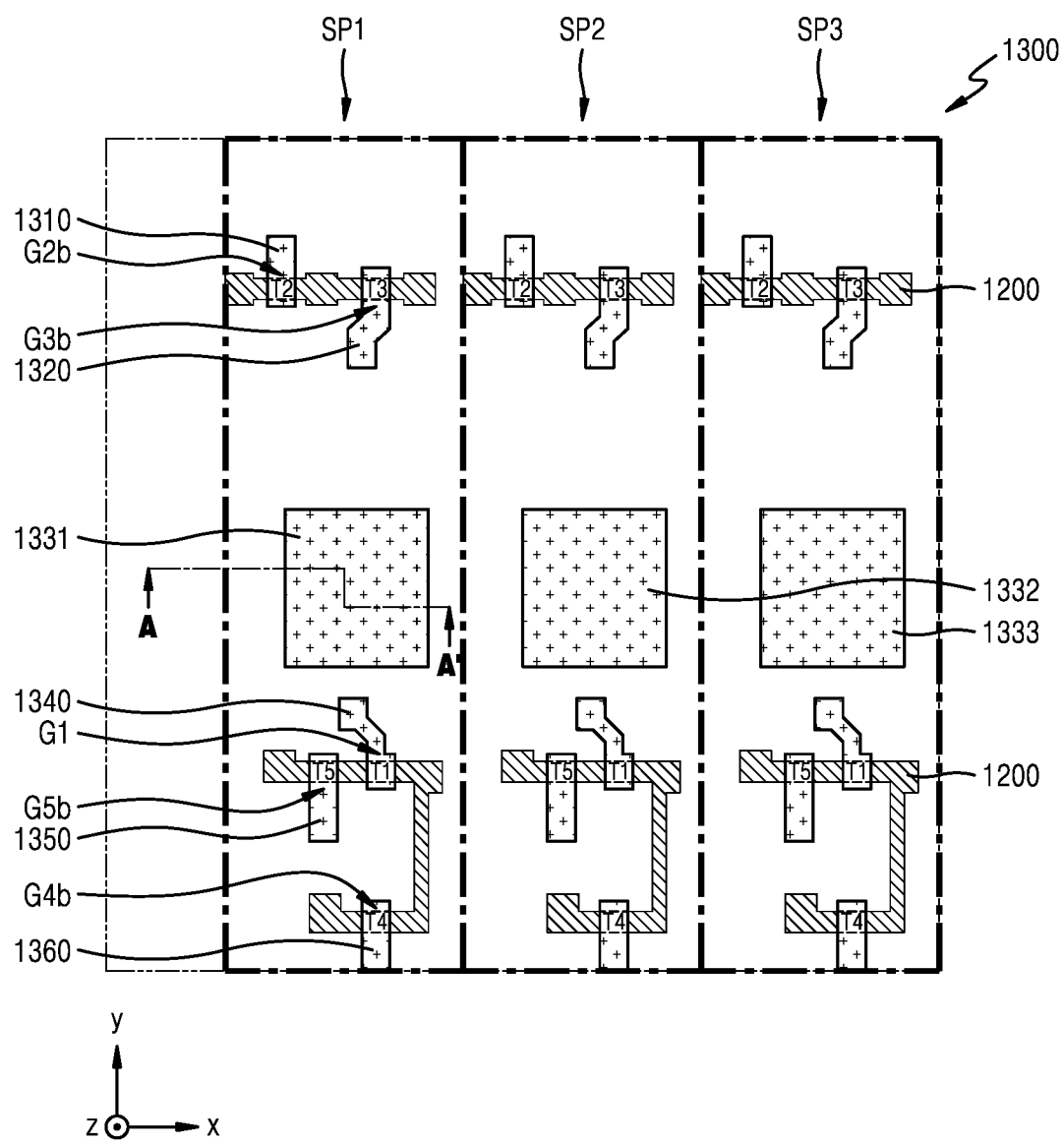

A first conductive layer 1300 as shown in FIG. 7 may be disposed on the first gate insulating layer 114. In FIG. 7, the first conductive layer 1300 is illustrated together with the semiconductor layer 1200 for convenience. The first conductive layer 1300 may include a driving gate electrode layer 1340, a switching gate electrode layer 1310, a reference voltage gate layer 1320, an initialization gate electrode layer 1360, an operation control gate electrode layer 1350, and a third capacitor electrode 1331. This first conductive layer 1300 may be referred to as a first gate layer.

A portion of the driving gate electrode layer 1340 overlaps the lower semiconductor layer 1200. A portion of the driving gate electrode layer 1340 overlapping the semiconductor layer 1200, for example, a portion overlapping the driving active area A1 of the semiconductor layer 1200 may be the driving gate electrode G1.

A portion of the switching gate electrode layer 1310 also overlaps the semiconductor layer 1200 disposed below the switching gate electrode layer 1310. A portion of the switching gate electrode layer 1310 overlapping the semiconductor layer 1200, for example, a portion overlapping the switching active area A2 of the semiconductor layer 1200 may be referred to as an upper switching gate electrode G2$b$. The upper switching gate electrode G2$b$ and the lower switching gate electrode G2$a$ electrically connected to the upper switching gate electrode G2$b$ may function as a gate electrode of the switching transistor T2.

A portion of the reference voltage gate layer 1320 also overlaps the semiconductor layer 1200 therebelow. A portion of the reference voltage gate layer 1320 overlapping the semiconductor layer 1200, for example, a portion of the semiconductor layer 1200 overlapping the reference voltage active area A3 may be referred to as an upper reference voltage gate electrode G3$b$. The upper reference voltage gate electrode G3$b$ and the lower reference voltage gate electrode G3$a$ electrically connected to the upper reference voltage gate electrode G3$b$ may function as a gate electrode of the reference voltage transistor T3.

A portion of the initialization gate electrode layer 1360 overlaps the lower semiconductor layer 1200. A portion of the initialization gate electrode layer 1360 overlapping the semiconductor layer 1200, for example, a portion overlapping the initialization active area A4 of the semiconductor layer 1200 may be referred to as an upper initialization gate electrode G4$b$. The upper initialization gate electrode G4$b$ and the lower initialization gate electrode G4$a$ electrically connected to the upper initialization gate electrode G4$b$ may function as a gate electrode of the initialization transistor T4.

A portion of the operation control gate electrode layer 1350 overlaps the lower semiconductor layer 1200. A portion of the operation control gate electrode layer 1350 overlapping the semiconductor layer 1200, for example, a portion overlapping the operation control active area A5 of the semiconductor layer 1200 may be referred to as an upper operation control gate electrode G5$b$. The upper operation control gate electrode G5$b$ and the lower operation control gate electrode G5$a$ electrically connected to the upper operation control gate electrode G5$b$ may function as a gate electrode of the operation control transistor T5.

The third capacitor electrode 1331 may have an isolated shape and may be disposed above the fourth capacitor electrode 1151. As described above, because the lower fourth capacitor electrode 1151 is the fourth capacitor electrode CE4 of the holding capacitor Chold of FIG. 3, the third capacitor electrode 1331 is the third capacitor electrode CE3 of the holding capacitor Chold of FIG. 3. Accordingly, the third capacitor electrode 1331 may constitute the holding capacitor Chold together with the fourth capacitor electrode 1151 as shown in FIG. 5. The third capacitor electrode 1331 is also the second capacitor electrode CE2 of the storage capacitor Cst of FIG. 3. In other words, the second capacitor electrode CE2 of the storage capacitor Cst of FIG. 3 and the third capacitor electrode CE3 of the holding capacitor Chold of FIG. 3 may be an integrated conductive layer as illustrated in FIG. 7.

The first conductive layer 1300 may include a metal, an alloy, a conductive metal oxide, or a transparent conductive material. For example, the first conductive layer 1300 may include Ag, alloy containing Ag, Mo, alloy containing Mo, Al, alloy containing Al, AlN, W, WN, Cu, Ni, Cr, CrN, Ti, Ta, Pt, Sc, indium tin oxide (ITO), or indium zinc oxide (IZO). The first conductive layer 1300 may have a multilayer structure. For example, the first conductive layer 1300 may have a two-layer structure including about a 300 Å-thick titanium layer and about a 2500 Å-thick molybdenum layer.

A second gate insulating layer 115 (see FIG. 11) covers or overlaps the first conductive layer 1300 and may be above the substrate 100. The second gate insulating layer 115 may include an insulating material. For example, the second gate insulating layer 115 may include an inorganic insulating layer such as silicon oxide, silicon nitride, silicon oxynitride, or aluminum oxide.

Figure 8:
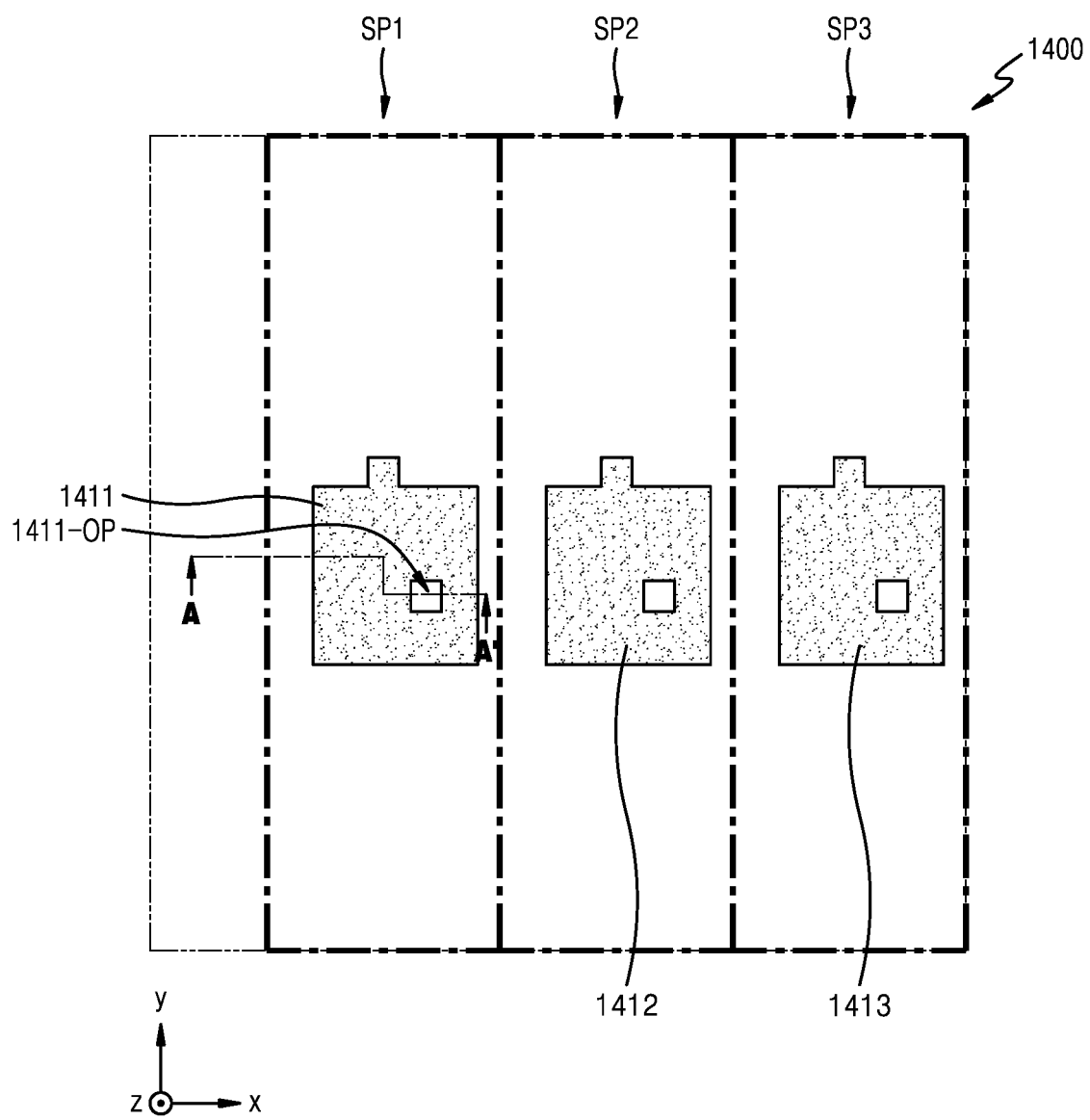

A second conductive layer 1400 as shown in FIG. 8 may be disposed on the second gate insulating layer 115. The second conductive layer 1400 may include a first capacitor electrode 1411. The first capacitor electrode 1411 is the first capacitor electrode CE1 of the storage capacitor Cst of FIG. 3. Accordingly, the first capacitor electrode 1411 may constitute the storage capacitor Cst together with the third capacitor electrode 1331 as shown in FIG. 7. This second conductive layer 1400 may be referred to as a second gate layer.

The second conductive layer 1400 may include a metal, an alloy, a conductive metal oxide, or a transparent conductive material. For example, the second conductive layer 1400 may include Ag, alloy containing Ag, Mo, alloy containing Mo, Al, alloy containing Al, AlN, W, WN, Cu, Ni, Cr, CrN, Ti, Ta, Pt, Sc, ITO, or IZO. The second conductive layer 1400 may have a molybdenum layer having a thickness of about 2500 Å. However, the second conductive layer 1400 may have a multilayer structure.

A first interlayer insulating layer 116 (see FIG. 11) covers or overlaps the second conductive layer 1400 and may be disposed on the second gate insulating layer 115. The first interlayer insulating layer 116 may include an insulating material. For example, the first interlayer insulating layer 116 may include silicon oxide, silicon nitride, silicon oxynitride, or aluminum oxide.

Figure 9:
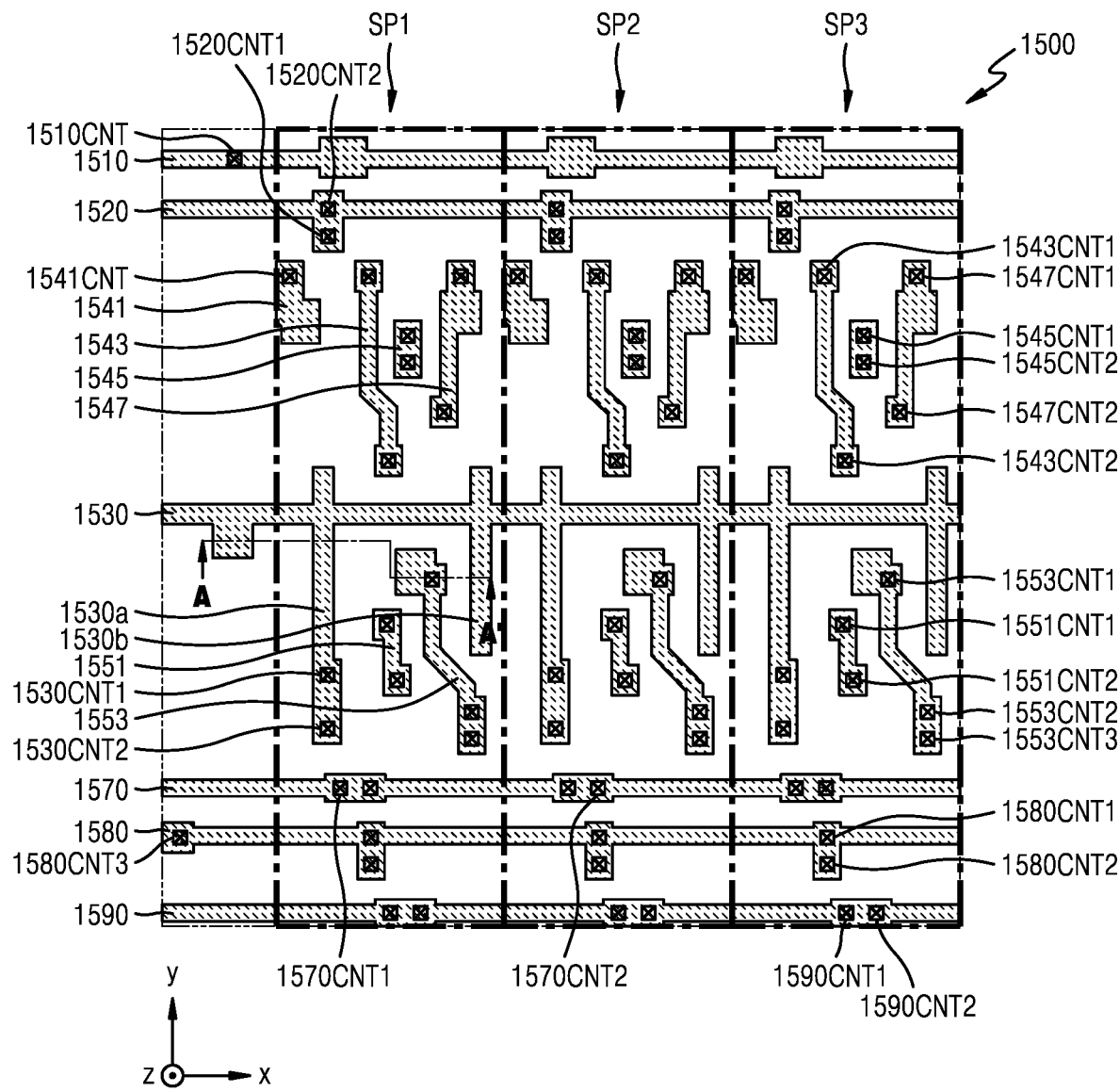

A third conductive layer 1500 as shown in FIG. 9 may be on the first gate insulating layer 116. The third conductive layer 1500 may include the first upper horizontal power line 1510, the upper write signal line 1520, the second horizontal power line 1530, the upper operation control signal line 1570, the upper initialization voltage line 1580, the upper initialization signal line 1590, a first connection electrode 1541, a second connection electrode 1543, a third connection electrode 1545, a fourth connection electrode 1547, a fifth connection electrode 1551, and a sixth connection electrode 1553. Among them, the first upper horizontal power line 1510, the upper write signal line 1520, the second horizontal power line 1530, the upper operation control signal line 1570, the upper initialization voltage line 1580, and the upper initialization signal line 1590 may extend in approximately the second direction (x-axis direction). The third conductive layer 1500 may be referred to as a first source or drain layer.

The first upper horizontal power line 1510 is disposed above the first lower horizontal power line 1110. The first upper horizontal power line 1510 may be electrically connected to the first lower horizontal power line 1110 through the contact hole 1510CNT. The first upper horizontal power line 1510 and the first lower horizontal power line 1110 may be components of the first horizontal power line.

The upper write signal line 1520 is disposed above the lower write signal line 1120. The upper write signal line 1520 may be electrically connected to the lower write signal line 1120 through the contact hole 1520CNT2. The upper write signal line 1520 is connected to the switching gate electrode layer 1310 through a contact hole 1520CNT1. For example, the upper write signal line 1520 is connected to the upper switching gate electrode G2b of the switching transistor T2. A set of the upper write signal line 1520 and the lower write signal line 1120 may correspond to the write signal line GWL of FIG. 3.

The second horizontal power line 1530 may form the second power line PL2 of FIG. 3 together with the second vertical power line 1620 to be described later.

The second horizontal power line 1530 has a shape extending in the second direction (x-axis direction) and has protrusions 1530a and 1530b protruding in the first direction (y-axis direction). The second horizontal power line 1530 is connected to the lower fourth capacitor electrode 1151 through the contact hole 1530CNT1 located in the protrusion 1530a, and is connected to one side or a side of the operation control active area A5 of the lower semiconductor layer 1200 through a contact hole 1530CNT2 located in the protrusion 1530a. For example, the second horizontal power line 1530 is electrically connected to the fourth capacitor electrodes 1151 and CE4 of the holding capacitor Chold and the operation control transistor T5.

The upper operation control signal line 1570 is disposed above the lower operation control signal line 1170. The upper operation control signal line 1570 may be connected to the lower operation control signal line 1170 through the contact hole 1570CNT1. The upper operation control signal line 1570 may be connected to the operation control gate electrode layer 1350 through a contact hole 1570CNT2. For example, the upper operation control signal line 1570 is connected to the upper operation control gate electrode G5b of the operation control transistor T5. A set of the upper operation control signal line 1570 and the lower operation control signal line 1170 may correspond to the operation control signal line EL of FIG. 3.

The upper initialization voltage line 1580 is disposed above the lower initialization voltage line 1180. The upper initialization voltage line 1580 may be connected to the lower initialization voltage line 1180 through the contact hole 1580CNT1. However, as shown in FIG. 9, the upper initialization voltage line 1580 may also be connected to the lower initialization voltage line 1180 through a contact hole 1580CNT3 located outside of the first sub-pixel SP1 to the third sub-pixel SP3. The upper initialization voltage line 1580 is connected to one side or a side of the initialization active area A4 of the semiconductor layer 1200 therebelow through a contact hole 1580CNT2. For example, the upper initialization voltage line 1580 is connected to the initialization transistor T4. The upper initialization voltage line 1580 and the lower initialization voltage line 1180 may correspond to the initialization voltage line VL of FIG. 3 together with the vertical initialization voltage line 1610 to be described later.

The upper initialization signal line 1590 is disposed above the lower initialization signal line 1190. The upper initialization signal line 1590 may be connected to the lower initialization signal line 1190 through the contact hole 1590CNT1. The upper initialization signal line 1590 may be connected to the initialization gate electrode layer 1360 through a contact hole 1590CNT2. For example, the upper initialization signal line 1590 is connected to the upper initialization gate electrode G4b of the initialization transistor T4. A set of the upper initialization signal line 1590 and the lower initialization signal line 1190 may correspond to the initialization signal line GIL of FIG. 3.

Each of the first connection electrode 1541, the second connection electrode 1543, the third connection electrode 1545, the fourth connection electrode 1547, the fifth connection electrode 1551, and the sixth connection electrode 1553 may have an isolated shape. They may be connected to other components above or below them through contact holes.

The first connection electrode 1541 is connected to one side or a side of the switching active area A2 of the semiconductor layer 1200 therebelow through a contact hole 1541CNT. The first data line 1631 on the upper portion is connected to the first connection electrode 1541 through a contact hole 1631CNT. For example, the first connection electrode 1541 electrically connects the first data line 1631 to the switching transistor T2.

The second connection electrode 1543 is connected to a portion between the switching active area A2 and the reference voltage active area A3 of the semiconductor layer 1200 through a contact hole 1543CNT1. The second connection electrode 1543 is connected to the first capacitor electrode 1411 through a contact hole 1543CNT2. As such, the second connection electrode 1543 electrically connecting the switching transistor T2, the reference voltage transistor T3, and the first capacitor electrode 1411 to each other may be understood to serve as the first node N1 of FIG. 3.

The third connection electrode 1545 is connected to the reference voltage gate layer 1320 through a contact hole 1545CNT1 and is connected to the reference voltage signal line 1130 through a contact hole 1545CNT2. For example, the third connection electrode 1545 electrically connects the gate electrode of the reference voltage transistor T3 to the reference voltage signal lines 1130 and GRL.

The fourth connection electrode 1547 is connected to one side or a side of the reference voltage active area A3 of the semiconductor layer 1200 through a contact hole 1547CNT1. The fourth connection electrode 1547 is connected to the horizontal reference voltage line 1140 through a contact hole 1547CNT2. For example, the fourth connection electrode 1547 electrically connects the reference voltage transistor T3 and the horizontal reference voltage line 1140 to each other.

The fifth connection electrode 1551 is connected to the first capacitor electrode 1411 through a contact hole 1551CNT1. The fifth connection electrode 1551 is connected to the driving gate electrode layer 1340 through a contact hole 1551CNT2. For example, the fifth connection electrode 1551 electrically connects the first capacitor electrodes 1411 and CE1 of the storage capacitor Cst to the driving gate electrode G1 of the driving transistor T1.

The sixth connection electrode 1553 is connected to the third capacitor electrode 1331 that is the second capacitor electrode CE2 of the storage capacitor Cst and the third capacitor electrode CE3 of the holding capacitor Chold through a contact hole 1553CNT1 passing through an opening 1411-OP of the first capacitor electrodes 1411 and CE1 of the storage capacitor Cst. The sixth connection electrode 1553 is connected to the driving shield layer 1160 through a contact hole 1553CNT2, and is connected to one side or a side of the driving active area A1 of the semiconductor layer 1200 through a contact hole 1553CNT3. For example, the sixth connection electrode 1553 electrically connects the second capacitor electrode CE2 of the storage capacitor Cst, the third capacitor electrode CE3 of the holding capacitor Chold, the driving shield layer 1160, and the driving transistor T1 to each other. This sixth connection electrode 1553 may be understood to serve as the second node N2 of FIG. 3.

The third conductive layer 1500 may include a metal, an alloy, a conductive metal oxide, or a transparent conductive material. For example, the third conductive layer 1500 may include Ag, alloy containing Ag, Mo, alloy containing Mo, Al, alloy containing Al, AlN, W, WN, Cu, Ni, Cr, CrN, Ti, Ta, Pt, Sc, ITO, or IZO. For example, the third conductive layer 1500 may have a multilayer structure including about a 700 Å-thick titanium layer, about a 6000 Å-thick aluminum layer, and about a 300 Å-thick titanium layer.

A second interlayer insulating layer 117 (see FIG. 11) covers or overlaps the third conductive layer 1500 and may be disposed on the first interlayer insulating layer 116. The second interlayer insulating layer 117 may include an insulating material. For example, the second interlayer insulating layer 117 may include silicon oxide, silicon nitride, silicon oxynitride, or aluminum oxide.

A fourth conductive layer 1600 as shown in FIG. 10 may be on the second interlayer insulating layer 117. The fourth conductive layer 1600 may include the first data line 1631, the $1^{st}$-$1^{st}$ vertical power line 1641, the vertical reference voltage line 1650, and a seventh connection electrode 1660 passing through a sub-pixel area. The fourth conductive layer 1600 may include the vertical initialization voltage line 1610 and the second vertical power line 1620 passing between pixels including the first sub-pixel SP1 to the third sub-pixel SP3. Each of the first data line 1631, the $1^{st}$-$1^{st}$ vertical power line 1641, the vertical reference voltage line 1650, the vertical initialization voltage line 1610, and the second vertical power line 1620 may have a shape extending approximately in the first direction (y-axis direction).

The first data line 1631 is connected to the lower first connection electrode 1541 through the contact hole 1631CNT, and as a result, is electrically connected to the switching transistor T2. For example, the first data line 1631 is connected to the lower first connection electrode 1541 through the contact hole 1631CNT, and is electrically connected to one side or a side of the switching active area A2 of the semiconductor layer 1200. The $1^{st}$-$1^{st}$ verticalpower line 1641 is connected to the first upper horizontal power line 1510 through a contact hole 1641CNT1. Because a set of the first lower horizontal power line 1110 and the first upper horizontal power line 1510 electrically connected to each other as described above may be referred to as the first horizontal power line, the $1^{st}$-$1^{st}$ vertical power line 1641 may form a first power line together with the first horizontal power line. The vertical reference voltage line 1650 is connected to the fourth connection electrode 1547 through a contact hole 1650CNT. As described above, the fourth connection electrode 1547 electrically connects the reference voltage transistor T3 to the horizontal reference voltage line 1140. As a result, the vertical reference voltage line 1650 is electrically connected to the horizontal reference voltage line 1140 and corresponds to the reference voltage line RL of FIG. 3.

The isolated seventh connection electrode 1660 is connected to the sixth connection electrode 1553 through a contact hole 1660CNT. As described above, the sixth connection electrode 1553 electrically connects the second capacitor electrode CE2 of the storage capacitor Cst, the third capacitor electrode CE3 of the holding capacitor Chold, the driving shield layer 1160, and the driving transistor T1 to each other. Accordingly, the seventh connection electrode 1660 may also be electrically connected to such components. The pixel electrode 210 disposed above the seventh connection electrode 1660 is connected to the seventh connection electrode 1660 through a contact hole 210CNT. Accordingly, the seventh connection electrode 1660 may be understood to serve as the second node N2 together with the sixth connection electrode 1553.

The vertical initialization voltage line 1610 is connected to the upper initialization voltage line 1580 through a contact hole 1610CNT. Accordingly, the vertical initialization voltage line 1610, along with the upper initialization voltage line 1580 and the lower initialization voltage line 1180 electrically connected to each other, may correspond to the initialization voltage line VL of FIG. 3.

The second vertical power line 1620 is connected to the second horizontal power line 1530 through a contact hole 1620CNT. The second vertical power line 1620 may correspond to the second power line PL2 of FIG. 3 together with the second horizontal power line 1530.

The fourth conductive layer 1600 may include a metal, an alloy, a conductive metal oxide, or a transparent conductive material. For example, the fourth conductive layer 1600 may include Ag, alloy containing Ag, Mo, alloy containing Mo, Al, alloy containing Al, AlN, W, WN, Cu, Ni, Cr, CrN, Ti, Ta, Pt, Sc, ITO, or IZO. For example, the fourth conductive layer 1600 may have a multilayer structure including about a 700 Å-thick titanium layer, about a 6000 Å-thick aluminum layer, and about a 300 Å-thick titanium layer. The fourth conductive layer 1600 may be referred to as a second source or drain layer.

A planarization layer 118 may cover or overlap the fourth conductive layer 1600 and may be disposed on the second interlayer insulating layer 117. The planarization layer 118 may include an organic insulating material. For example, the planarization layer 118 may include photoresist, benzocyclobutene (BCB), polyimide, hexamethyldisiloxane (HMDSO), polymethylmethacrylate (PMMA), polystyrene, a polymer derivative having a phenol-based group, an acrylic polymer, an imide polymer, an aryl ether polymer, an amide polymer, a fluorine polymer, a p-xylene polymer, a vinyl alcohol-based polymer, or a mixture thereof. For example, the planarization layer 118 may include a polyimide layer having a thickness of approximately 1.6 μm.

The organic light-emitting diode OLED may be disposed on the planarization layer 118. The organic light-emitting diode OLED may include the pixel electrode 210, an intermediate layer 220 including an emission layer, and the opposite electrode 230.

The pixel electrode 210 may be a (semi-) transparent electrode or a reflective electrode. For example, the pixel electrode 210 may include a reflective layer including Ag, Mg, Al, Pt, Pd, Au, Ni, Nd, Ir, Cr, and a compound thereof, and a transparent or semi-transparent electrode layer disposed on the reflective layer. The transparent or semi-transparent electrode layer may include at least one of ITO, IZO, zinc oxide (ZnO), indium oxide ($In_2O_3$), indium gallium oxide (IGO), and aluminum zinc oxide (AZO). For example, the pixel electrode 210 may have a three-layer structure of ITO/Ag/ITO.

A pixel defining layer 119 may be disposed on the planarization layer 118. The pixel defining layer 119 may prevent an arc or the like from occurring at the edge of the pixel electrode 210 by increasing a distance between the edge of the pixel electrode 210 and the opposite electrode 230 above the pixel electrode 210. The pixel defining layer 119 may include at least one organic insulating material from among polyimide, polyamide, acrylic resin, BCB, and phenolic resin, and may be formed by spin coating or the like within the spirit and the scope of the disclosure.

At least a portion of the intermediate layer 220 of the organic light-emitting diode OLED may be located in an opening formed by the pixel defining layer 119. The emission area of the organic light-emitting diode OLED may be defined by the opening.

The intermediate layer 220 may include an emission layer. The emission layer may include an organic material including a fluorescent or phosphorescent material that emits red, green, blue, or white light. The emission layer may include a low-molecular weight organic material or a high-molecular weight organic material. A functional layer such as a hole transport layer (HTL), a hole injection layer (HIL), an electron transport layer (ETL), or an electron injection layer (EIL) may selectively be further arranged over and below the emission layer.

The emission layer may have a patterned shape corresponding to each of pixel electrodes 210. Layers other than the emission layer included in the intermediate layer 220 may be modified in various ways, such as being integrated across the pixel electrodes 210.

The opposite electrode 230 may be a transparent electrode or a reflective electrode. For example, the opposite electrode 230 may be a transparent electrode or a reflective electrode, and may include a metal thin-film, which has a small work function, including Li, Ca, lithium fluoride (LiF), Al, Ag, Mg, or a compound thereof. The opposite electrode 230 may further include a transparent conductive oxide (TCO) layer such as ITO, IZO, ZnO, $ZnO_2$, or $In_2O_3$ disposed on the metal thin film. The opposite electrode 230 may be integrally formed as a single body over the entire surface of the display area DA and arranged above the intermediate layer 220 and the pixel defining layer 119.

The configuration of the first sub-pixel SP1 has been described, but this description may also be applied to the second sub-pixel SP2 and/or the third sub-pixel SP3. For reference, in FIGS. 4 to 10, the fourth capacitor electrode 1151, the third capacitor electrode 1331, the first capacitor electrode 1411, the first data line 1631, and the $1^{st}$-$1^{st}$ vertical power line 1641 are illustrated as being located in the first sub-pixel SP1 or passing through the first sub-pixel SP1, and for convenience, reference numerals are distinguished from them to show that a fourth capacitor electrode 1152, a third capacitor electrode 1332, a first capacitor electrode 1412, a second data line 1632, and a $1^{st}$-$2^{nd}$ vertical power line 1642 are located in the second sub-pixel SP2 or passing through the second sub-pixel SP2. A fourth capacitor electrode 1153, a third capacitor electrode 1333, a first capacitor electrode 1413, a third data line 1633, and a first-3 vertical power line 1643 are illustrated as being located in the third sub-pixel SP3 or passing through the third sub-pixel SP3 by using the reference numerals distinguished therefrom. Because the pixel electrode 210 is located in each of the first sub-pixel SP1 to the third sub-pixel SP3, the pixel electrode 210 located in the first sub-pixel SP1 may be referred to as a first pixel electrode, the pixel electrode 210 located in the second sub-pixel SP2 may be referred to as a second pixel electrode, and the pixel electrode 210 located in the third sub-pixel SP3 may be referred to as a third pixel electrode.

The second data line 1632 is electrically connected to the corresponding first connection electrode 1541 under or below the second data line 1632 through a contact hole 1632CNT, and the third data line 1633 is electrically connected to the corresponding first connection electrode 1541 under or below the third data line 1633 through a contact hole 1633CNT and is electrically connected to corresponding portions of the semiconductor layer 1200.

In the display apparatus according to an embodiment as described above, the $1^{st}$-1st vertical power line 1641 extends in the first direction (y-axis direction) to pass through the first sub-pixel SP1, the $1^{st}$-$2^{nd}$ vertical power line 1642 extends in the first direction (y-axis direction) to pass through the second sub-pixel SP2, and the first-3 vertical power line 1643 extends in the first direction (y-axis direction) to pass through the third sub-pixel SP3. The first lower horizontal power line 1110 and the first upper horizontal power line 1510 electrically connected to each other to form a first horizontal power line extend in the second direction (x-axis direction).

The first horizontal power line is disposed on a layer different from a layer on which the $1^{st}$-$1^{st}$ vertical power line 1641, the $1^{st}$-$2^{nd}$ vertical power line 1642, and the first-3 vertical power line 1643 are disposed, but is electrically connected to the $1^{st}$-$1^{st}$ vertical power line 1641, the $1^{st}$-$2^{nd}$ vertical power line 1642, and the first-3 vertical power line 1643. For example, the first horizontal power line is connected to the $1^{st}$-$1^{st}$ vertical power line 1641 in the first sub-pixel SP1 through the contact hole 1641CNT1, is connected to the $1^{st}$-$2^{nd}$ vertical power line 1642 in the second sub-pixel SP2 through a contact hole 1642CNT1, and is connected to the first-3 vertical power line 1643 in the third sub-pixel SP3 through a contact hole 1643CNT1. For example, in case that each of the $1^{st}$-$1^{st}$ vertical power line 1641, the $1^{st}$-$2^{nd}$ vertical power line 1642, and the first-3 vertical power line 1643 is called a first vertical power line, a first vertical power line exists for each column of sub-pixels, and a first horizontal power line exists for each row of sub-pixels. Furthermore, the first vertical power lines and the first horizontal power lines are electrically connected to each other through a contact hole in the respective sub-pixels. Because each of the first horizontal power lines has a two-layer structure of the first lower horizontal power line 1110 and the first upper horizontal power line 1510, the resistance thereof may be dramatically reduced. Accordingly, the potential of the first vertical power lines and the first horizontal power lines may be kept constant by minimizing an IR-drop in the entire display area DA (see FIG. 1).

The opposite electrode 230 of the organic light-emitting diode OLED is electrically connected to the first vertical power lines and the first horizontal power lines outside the display area DA. However, as described above, the first power supply wiring having a loop shape with one side open or a side open may be electrically connected to the first vertical power lines and the first horizontal power lines, and the opposite electrode 230 may be electrically connected to the first power supply wiring. Through the first vertical power lines and the first horizontal power lines as described above, a deviation in the first power voltage ELVSS applied to the opposite electrode 230 in sub-pixels in the display area DA may be prevented or minimized.

As described above, the driving transistor T1 or the like may be an n-channel MOSFET (NMOS) thin-film transistor because it may include an oxide semiconductor material. The luminance of the organic light-emitting diode OLED is determined according to a potential difference between the driving gate electrode G1 of the driving transistor T1 and the second node N2 serving as a source area. Therefore, a first power voltage, which affects the potential of the second node N2, has no deviation or needs to be minimized in the sub-pixels. Otherwise, even if the data signal DT for emitting light with a same luminance is applied to sub-pixels, the sub-pixels emit light with different luminance, which ultimately leads to deterioration of a displayed image.

However, as described above, the display apparatus according to an embodiment may prevent or minimize the occurrence of a deviation in the first power voltage ELVSS applied to the opposite electrode 230 in the sub-pixels in the display area DA. Accordingly, a display apparatus that displays a high-quality image may be implemented.

On the other hand, as shown in FIG. 9, the second horizontal power line 1530 has a shape extending in the second direction (x-axis direction) and has the portions 1530a and 1530b protruding in the first direction (y-axis direction). As can be seen in FIG. 11, which is a schematic cross-sectional view, the protrusion 1530a is interposed between the first data line 1631 of the first sub-pixel SP1 and the first capacitor electrode 1411 of the first sub-pixel SP1. Similarly, the protrusion 1530b is interposed between the second data line 1632 of the second sub-pixel SP2 and the first capacitor electrode 1411 of the first sub-pixel.

As described above, because the first capacitor electrode 1411 is electrically connected to the driving gate electrode G1 of the driving transistor T1, the first capacitor electrode 1411 plays an important role in determining the amount of current flowing through the organic light-emitting diode OLED. The protrusion 1530a is interposed between the first data line 1631 of the first sub-pixel SP1 and the first capacitor electrode 1411 of the first sub-pixel SP1, and prevents or minimizes the influence of the potential of the first capacitor electrode 1411 of the first sub-pixel SP1 by the first data line 1631 of the first sub-pixel SP1. The protrusion 1530b is interposed between the second data line 1632 of the second sub-pixel SP2 and the first capacitor electrode 1411 of the first sub-pixel, and may prevent or minimize the influence of the first capacitor electrode 1411 of the first sub-pixel by the second data line 1632 of the second sub-pixel SP2. For example, because the second horizontal power line 1530 maintains the constant second power voltage ELVDD, electromagnetic shielding of the first capacitor electrode 1411 may be ensured. The same applies to the first capacitor electrode 1412 of the second sub-pixel SP2 and the first capacitor electrode 1413 of the third sub-pixel SP3.

Figure 12:
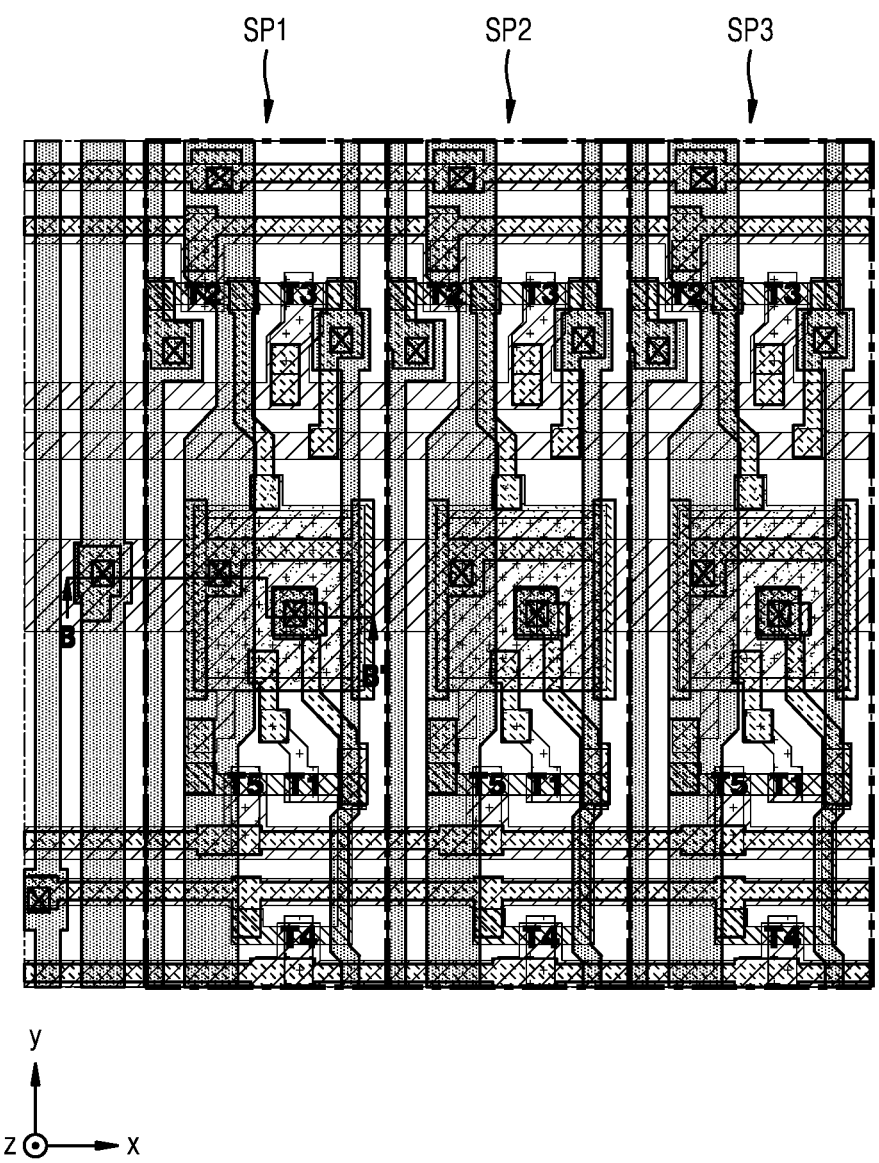
FIG. 12 is a schematic plan diagram schematically illustrating positions of transistors and capacitors in pixels included in a display apparatus according to an embodiment.
Figure 13:
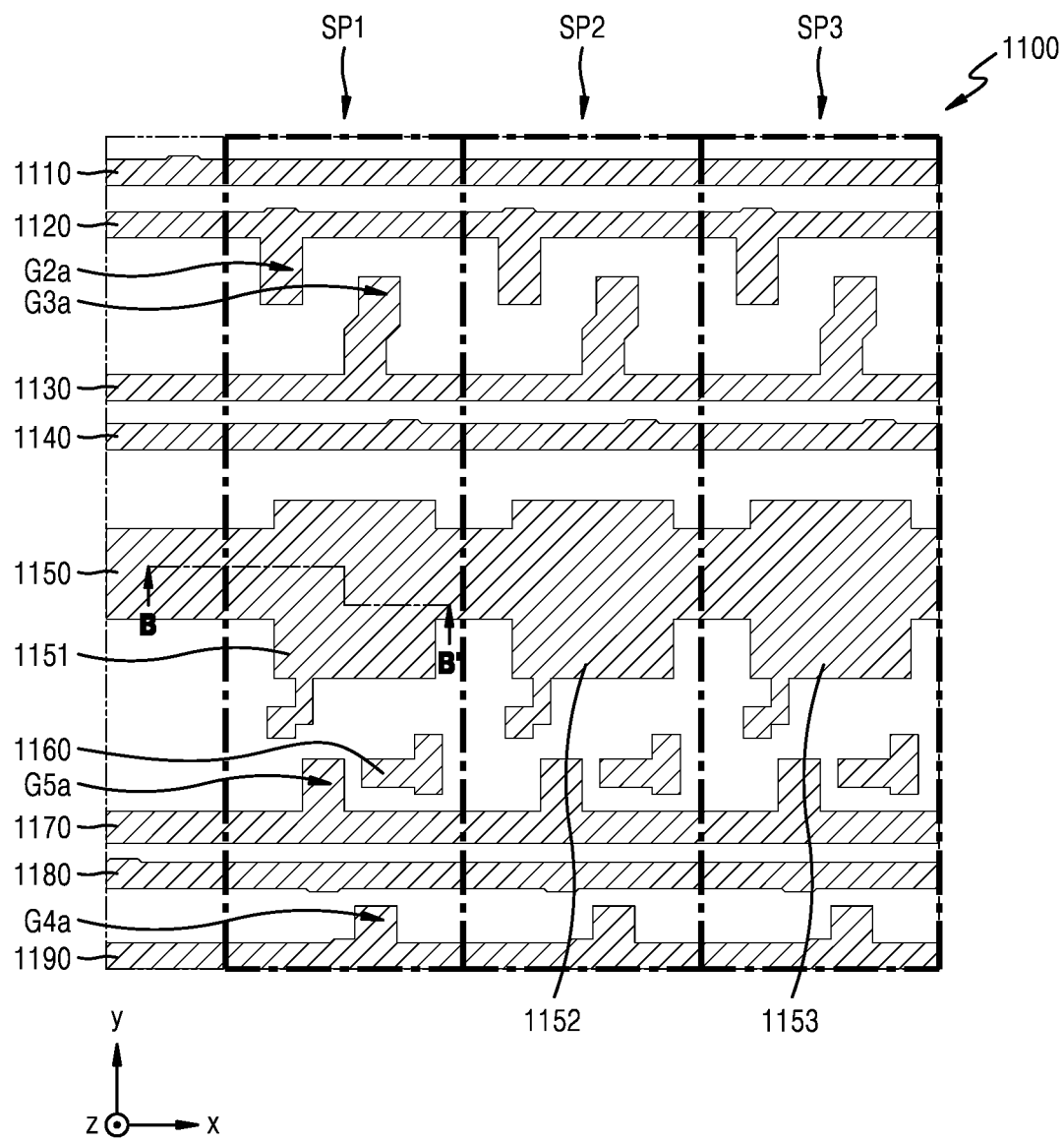
FIGS. 13 to 15 are schematic plan views schematically illustrating components, such as transistors and capacitors, of the display apparatus of FIG. 12, for each layer.
Figure 14:
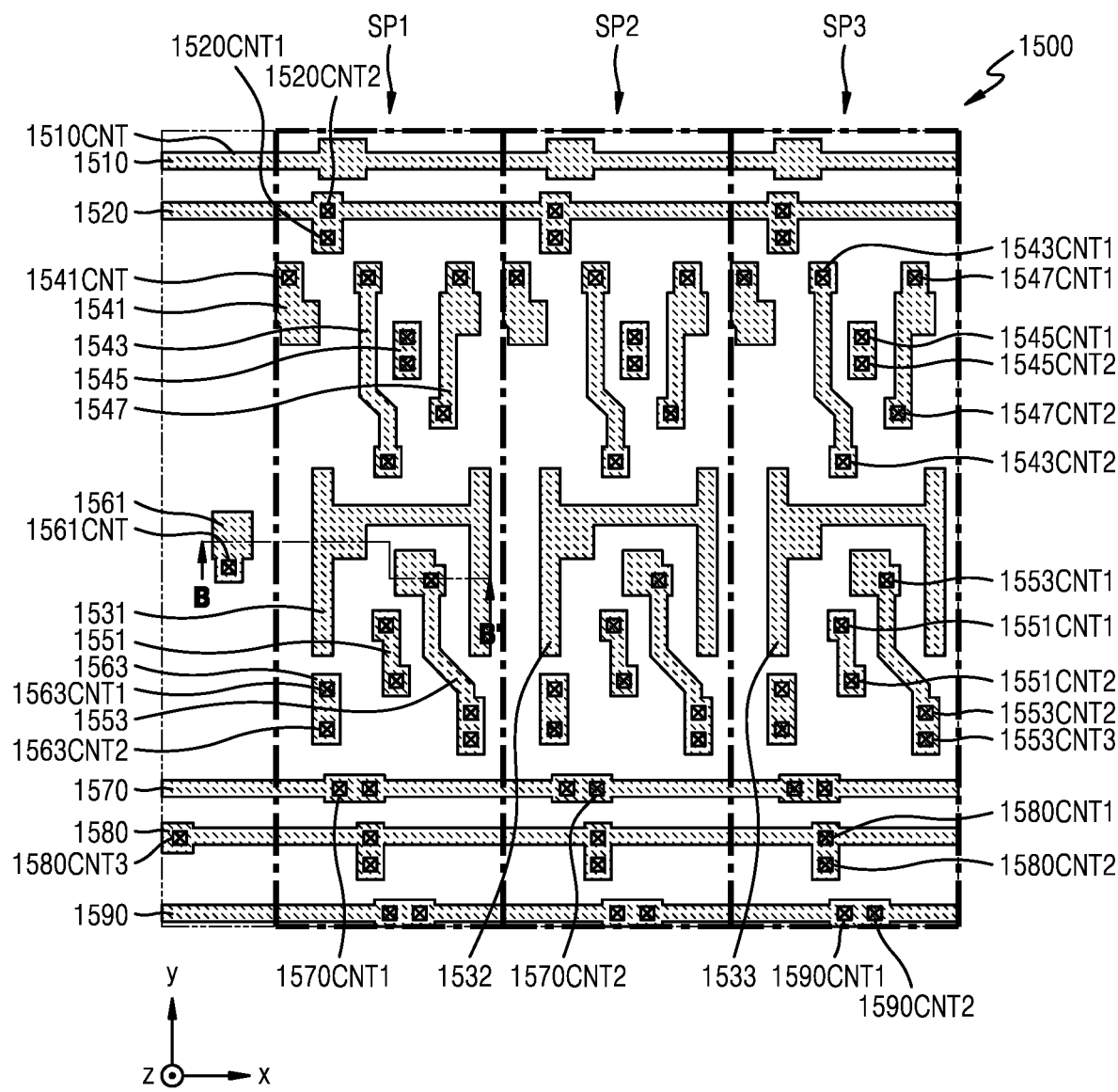
Figure 15:
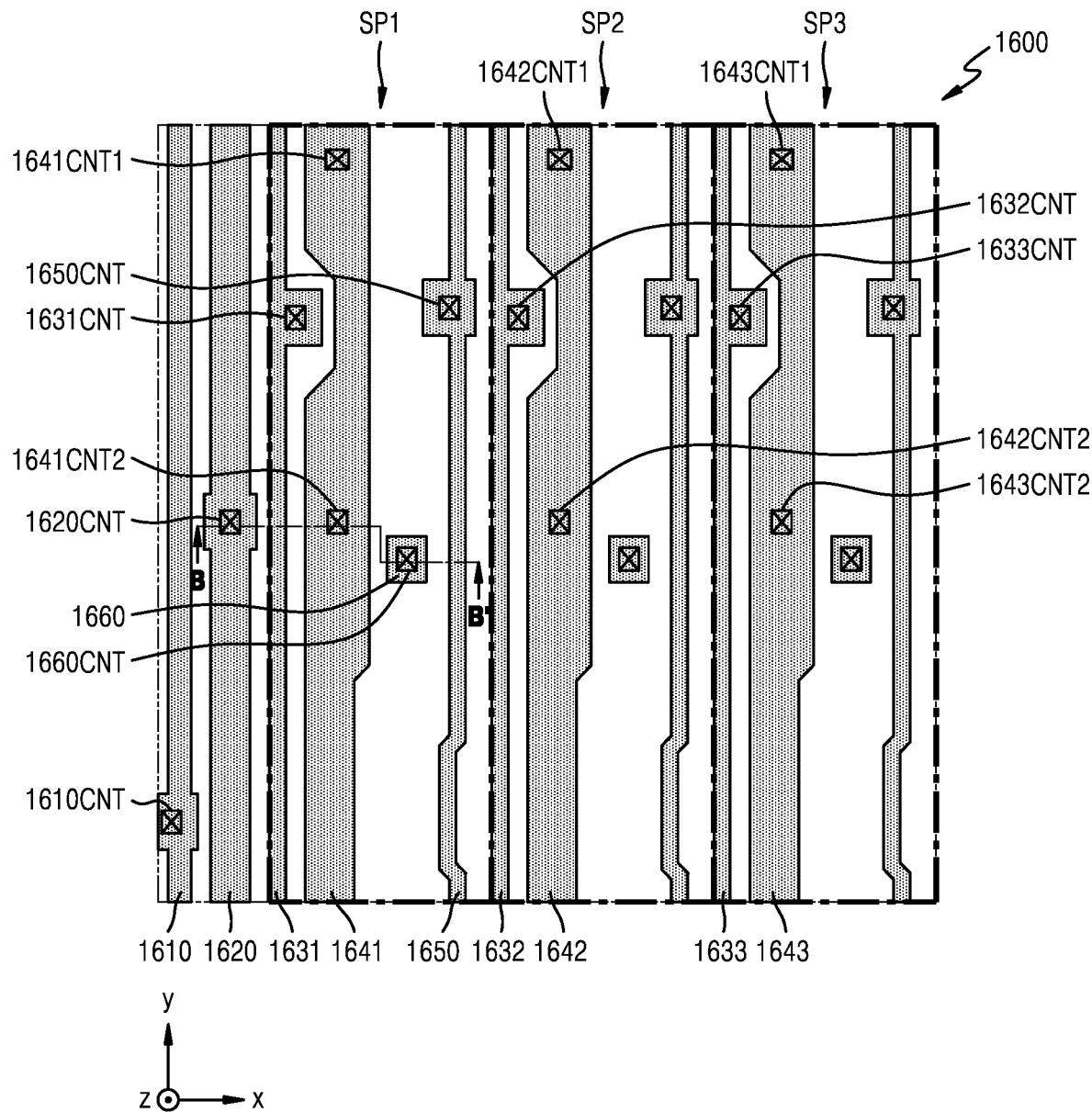
Figure 16:
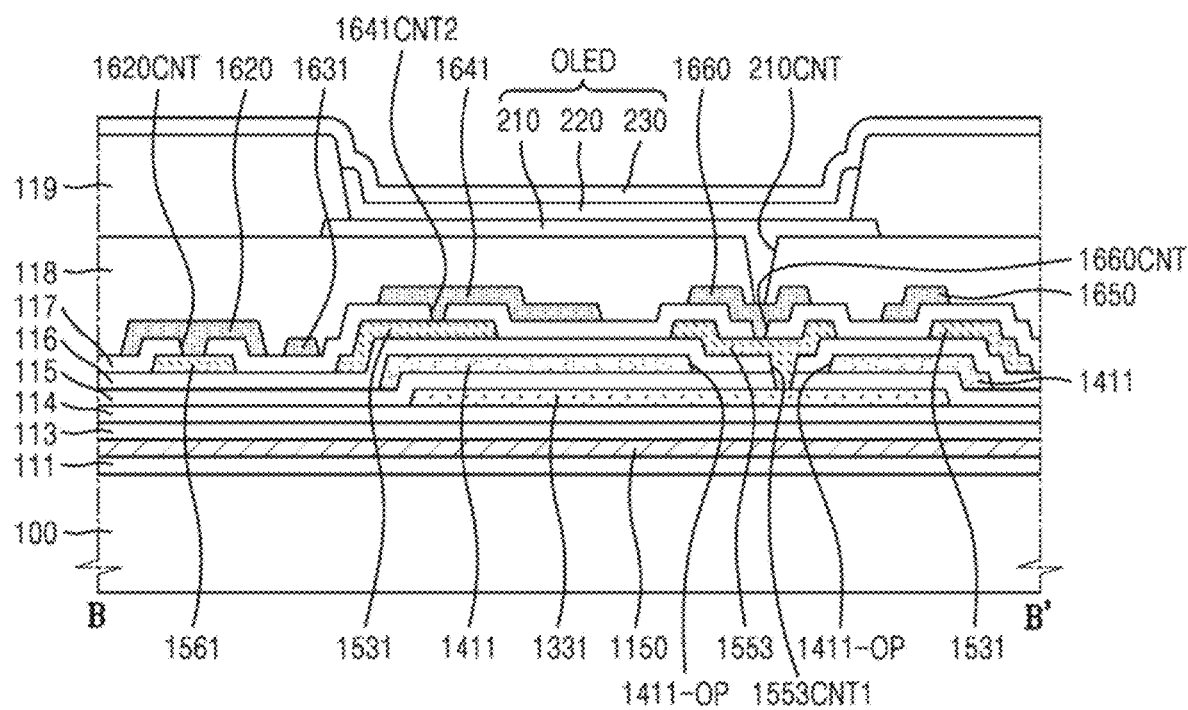
FIG. 16 is a schematic cross-sectional view schematically illustrating a cross-section taken along line B-B' of the display apparatus shown in FIG. 12.

FIG. 12 is a schematic plan view schematically illustrating positions of the thin-film transistors T1 to T5, the storage capacitor Cst, and the holding capacitor Chold in pixels included in a display apparatus according to an embodiment, FIGS. 13 to 15 are schematic plan views schematically illustrating components such as the thin-film transistors T1 to T5, the storage capacitor Cst, and the holding capacitor Chold of the display apparatus shown in FIG. 12 for each layer, and FIG. 16 is a schematic cross-sectional view schematically illustrating a cross-section taken along line A-A' of the display apparatus shown in FIG. 12. In the case of layer-by-layer schematic plan views, FIG. 13 shows the lower metal layer 1100, FIG. 14 shows the third conductive layer 1500, and FIG. 15 shows the fourth conductive layer 1600. Because the semiconductor layer 1200, the first conductive layer 1300, and the second conductive layer 1400 may be the same as those described above with reference to FIGS. 6 to 8, they may be omitted.

In the display apparatus according to the above-described embodiment, the second horizontal power line 1530 is located in the third conductive layer 1500 as shown in FIG. 9. However, in the display apparatus according to an embodiment, as shown in FIG. 13, the second horizontal power line 1150 is disposed on the lower metal layer 1100.

For example, the second horizontal power line 1150 and the first lower horizontal power line 1110 may be disposed on a same layer. At this time, the second horizontal power line 1150 may be integrated with the fourth capacitor electrode 1151 of the first sub-pixel SP1, the fourth capacitor electrode 1152 of the second sub-pixel SP2, and the fourth capacitor electrode 1153 of the third sub-pixel SP3.

In the case of the third conductive layer 1500, unlike the display apparatus according to the above-described embodiment, the third conductive layer 1500 does not include the second horizontal power line 1530, but has a first shield layer 1531, an eighth connection electrode 1561, and a ninth connection electrode 1563.

Similar to the protrusion 1530a of the display apparatus according to the above-described embodiment, the first shield layer 1531 is interposed between the first data line 1631 of the first sub-pixel SP1 and the first capacitor electrode 1411 of the first sub-pixel SP1, and prevents or minimizes the influence of the potential of the first capacitor electrode 1411 of the first sub-pixel SP1 by the first data line 1631 of the first sub-pixel SP1. Similar to the protrusion 1530b of the display apparatus according to the above-described embodiment, the first shield layer 1531 is interposed between the second data line 1632 of the second sub-pixel SP2 and the first capacitor electrode 1411 of the first sub-pixel, and may prevent or minimize the influence of the first capacitor electrode 1411 of the first sub-pixel by the second data line 1632 of the second sub-pixel SP2. Furthermore, in order to maximize this shielding effect, the $1^{st}$-$1^{st}$ vertical power line 1641 disposed above the first shield layer 1531 may be electrically connected to the first shield layer 1531 through a contact hole 1641CNT2. Through this, the constant first power voltage ELVSS is applied to the first shield layer 1531, thereby ensuring electromagnetic shielding of the first capacitor electrode 1411.

The second sub-pixel SP2 also has a second shield layer 1532, and may allow the $1^{st}$-$2^{nd}$ vertical power line 1642 to be electrically connected to the second shield layer 1532 through a contact hole 1642CNT2. The third sub-pixel SP3 also has a second shield layer 1533, and may allow the first-3 vertical power line 1643 to be electrically connected to the third shield layer 1533 through a contact hole 1643CNT2.

The eighth connection electrode 1561 is connected to the second horizontal power line 1150 located in the lower metal layer 1100 through a contact hole 1561CNT, and the second vertical power line 1620 disposed above the eighth connection electrode 1561 is connected to the eighth connection electrode 1561 through the contact hole 1620CNT. For example, the eighth connection electrode 1561 may connect the second vertical power line 1620 to the second horizontal power line 1150.

The ninth connection electrode 1563 is connected to the lower fourth capacitor electrode 1151 through a contact hole 1563CNT1, and is connected to one side or a side of the operation control active area A5 of the lower semiconductor layer 1200 through a contact hole 1563CNT2. For example, the ninth connection electrode 1563 electrically connects the fourth capacitor electrodes 1151 and CE4 of the holding capacitor Chold to the operation control transistor T5.

Figure 17:
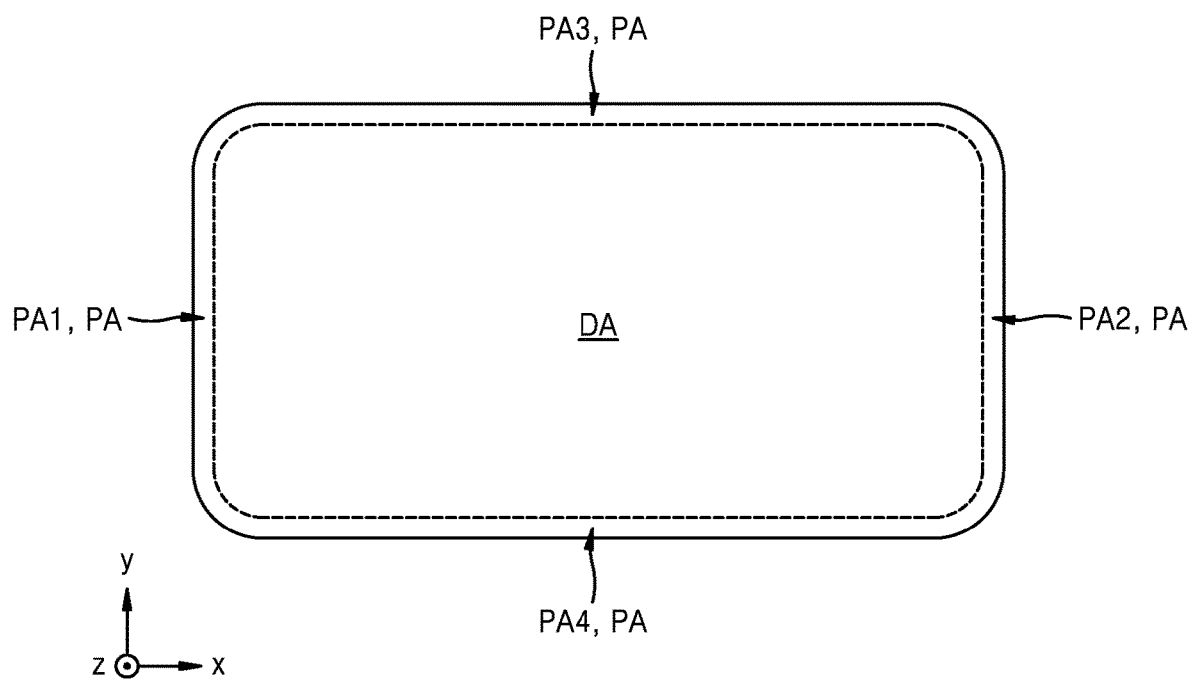
FIG. 17 is a schematic plan view of a display apparatus according to an embodiment.

FIG. 17 is a schematic plan view of a display apparatus according to an embodiment. Among the descriptions of the display apparatus according to the embodiment described above with reference to FIG. 1 and the like, contents applicable to the display apparatus according to an embodiment may be omitted.

A display panel provided in the display apparatus according to an embodiment has the display area DA having a greater shape in a second horizontal direction (x-axis direction) than in the first direction (y-axis direction). In case that the display panel has the display area DA of such a shape, it may be understood that the substrate 100 (see FIG. 21) included in the display panel has the display area DA of such a shape. Hereinafter, for convenience, the substrate 100 will be described as having the display area DA and the peripheral area PA.

The peripheral area PA may be arranged outside of the display area DA. In FIG. 17, the peripheral area PA has a shape extending in the first direction (y-axis direction) and may include a first peripheral area PA1 and a second peripheral area PA2 located on both sides of the display area DA in the second direction (x-axis direction), and has a shape extending in the second direction (x-axis direction) and may include a third peripheral area PA3 and a fourth peripheral area PA4 located on both sides of the display area DA in the first direction (y-axis direction).

Although not shown in FIG. 17, the display panel may be bent by having a bending area. When viewed in the z-axis direction, a portion of the display panel may overlap another portion of the display panel. The overlapping portion may be a non-display area, and through this, the area of the non-display area recognized when the display apparatus is viewed from the front (in the −z direction) may be minimized.

Various driving circuits may be located in the peripheral area PA of the display panel. For example, a scan driving circuit may be located in at least one of the first peripheral area PA1 and the second peripheral area PA2 on both sides of the display area DA in the second direction (x-axis direction). A driving chip including an integrated circuit for driving the display panel may be arranged in the peripheral area PA of the display panel. The integrated circuit may be a data driving integrated circuit that generates a data signal, but the disclosure is not limited thereto.

As described in the above embodiment, pixels are located in the display area DA. Each of the pixels may include sub-pixels, and each of the sub-pixels may include a display apparatus such as the organic light-emitting diode OLED. The sub-pixel may emit, for example, red, green, blue, or white light.

The sub-pixel may be electrically connected to external circuits arranged in the peripheral area PA. A scan driving circuit, an operation control driving circuit, a terminal, a first power supply wire, and a second power supply wiring may be arranged in the peripheral area PA. The scan driving circuit may provide a scan signal to a pixel through scan lines such as a write signal line, a reference voltage signal line, or an initialization signal line.

For reference, the schematic diagram of the equivalent circuit illustrated in FIG. 3 may be a schematic diagram of an equivalent circuit of one sub-pixel SP included in the display apparatus illustrated in FIG. 17. Accordingly, the contents described above with reference to FIG. 3 may also be applied to the display apparatus according to an embodiment. However, although FIG. 3 shows that the thin-film transistors T1 to T5 are NMOS, the disclosure is not limited thereto. The thin-film transistors T1 to T5 may be a p-channel MOSFET (PMOS), some or a number of the thin-film transistors T1 to T5 may be PMOS and others may be NMOS, and various modifications are possible.

Figure 18:
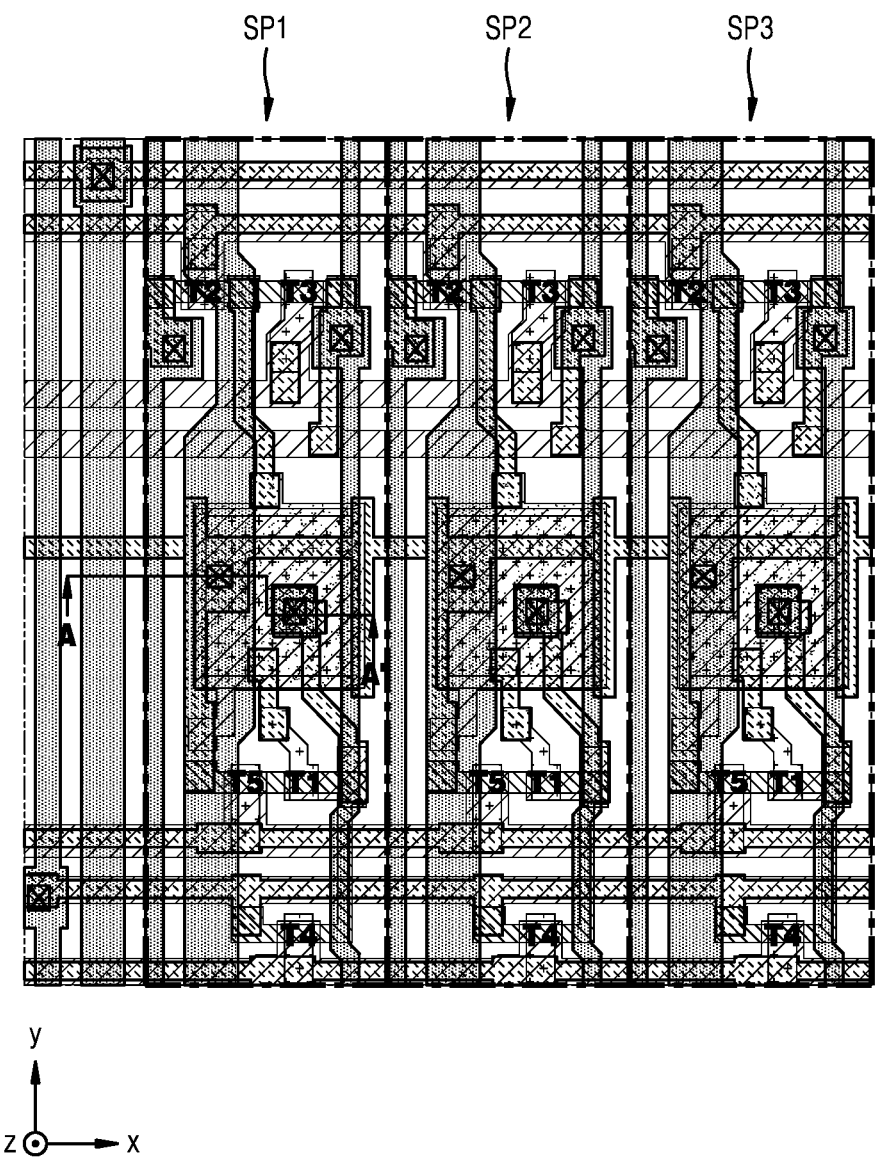
FIG. 18 is a schematic plan view schematically illustrating positions of transistors and capacitors in pixels included in the display apparatus of FIG. 1.
Figure 19:
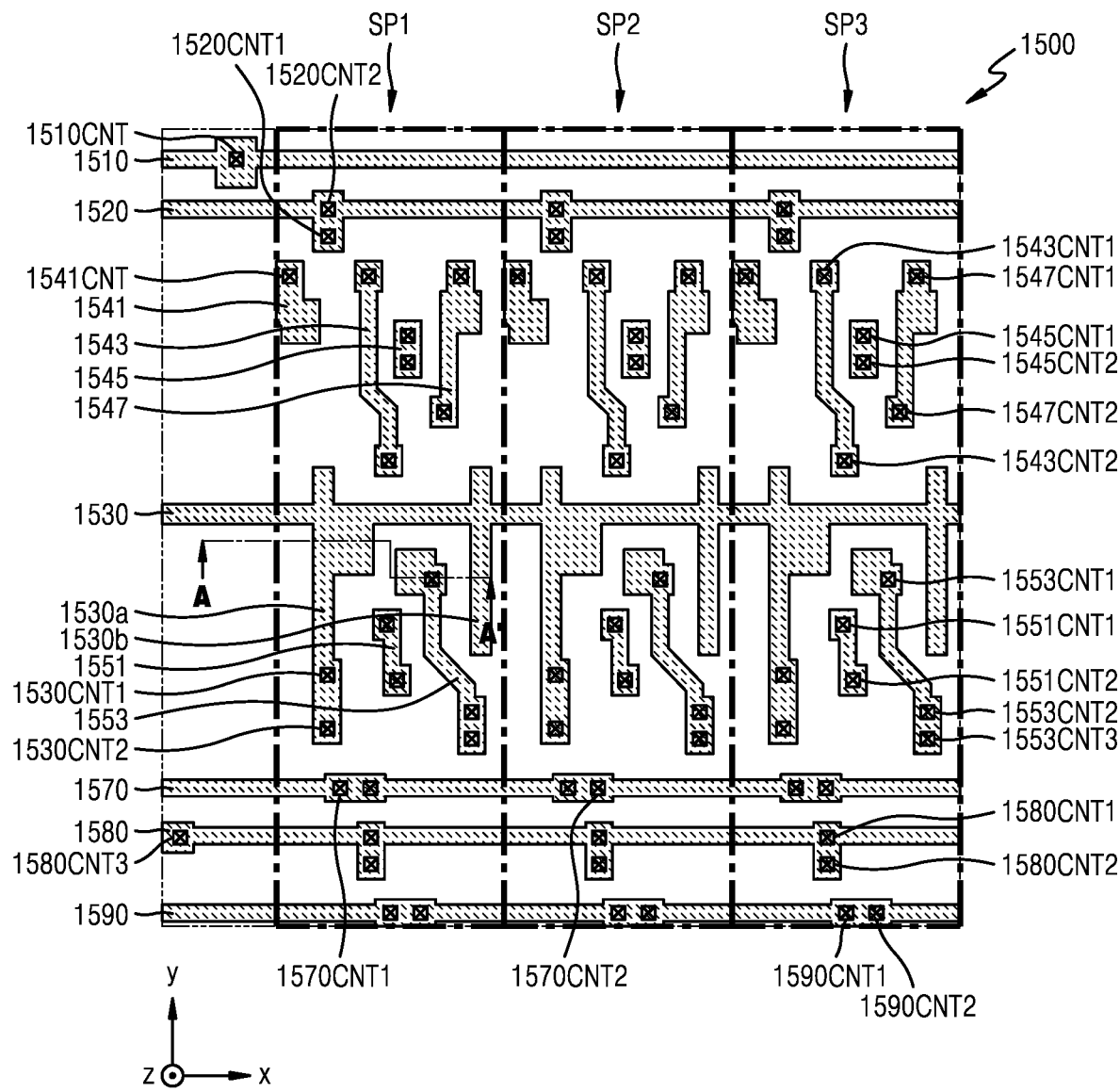
FIGS. 19 to 20 are schematic plan views schematically illustrating components, such as transistors and capacitors, of the display apparatus shown in FIG. 18, for each layer.
Figure 20:
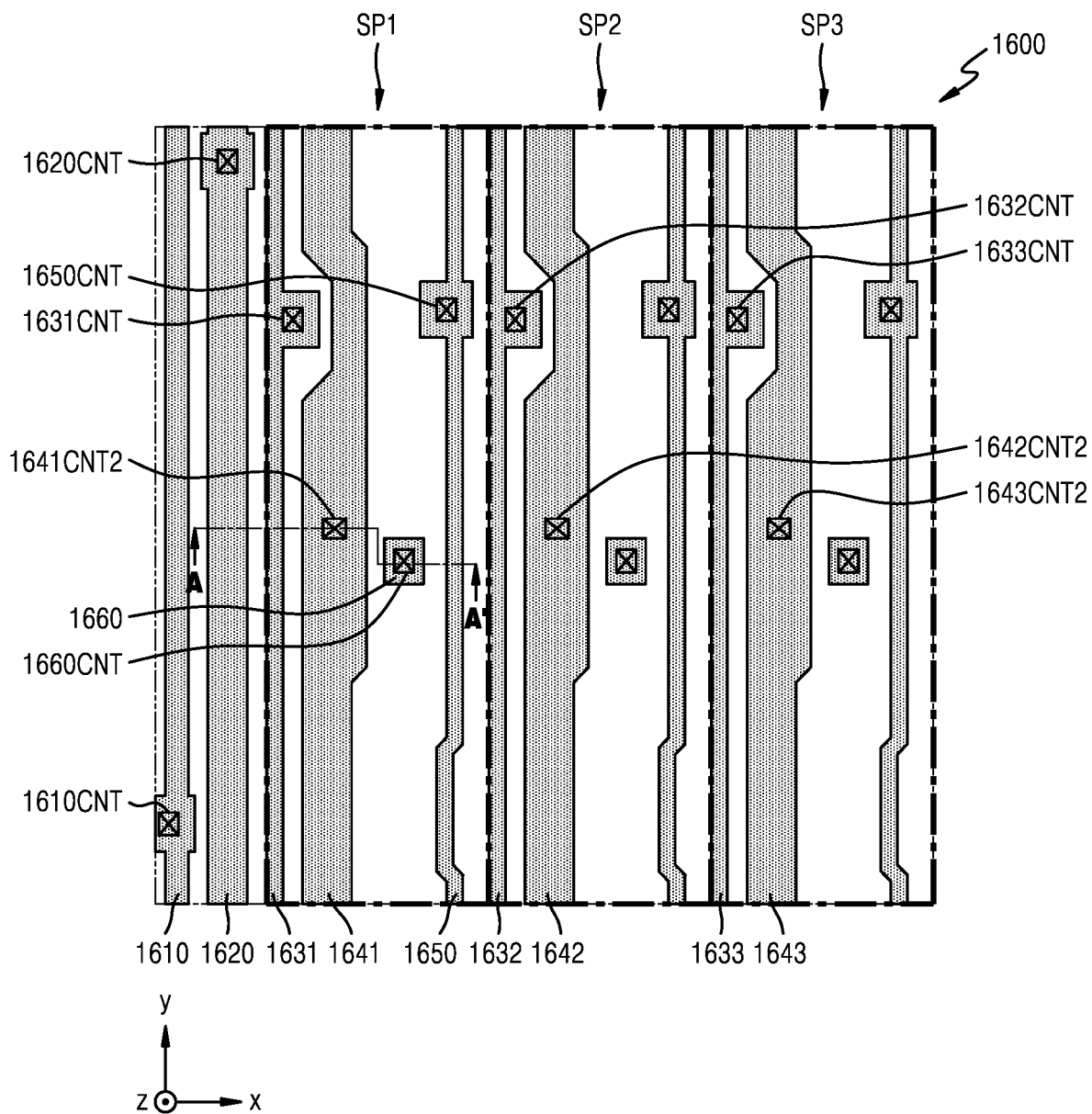
Figure 21:
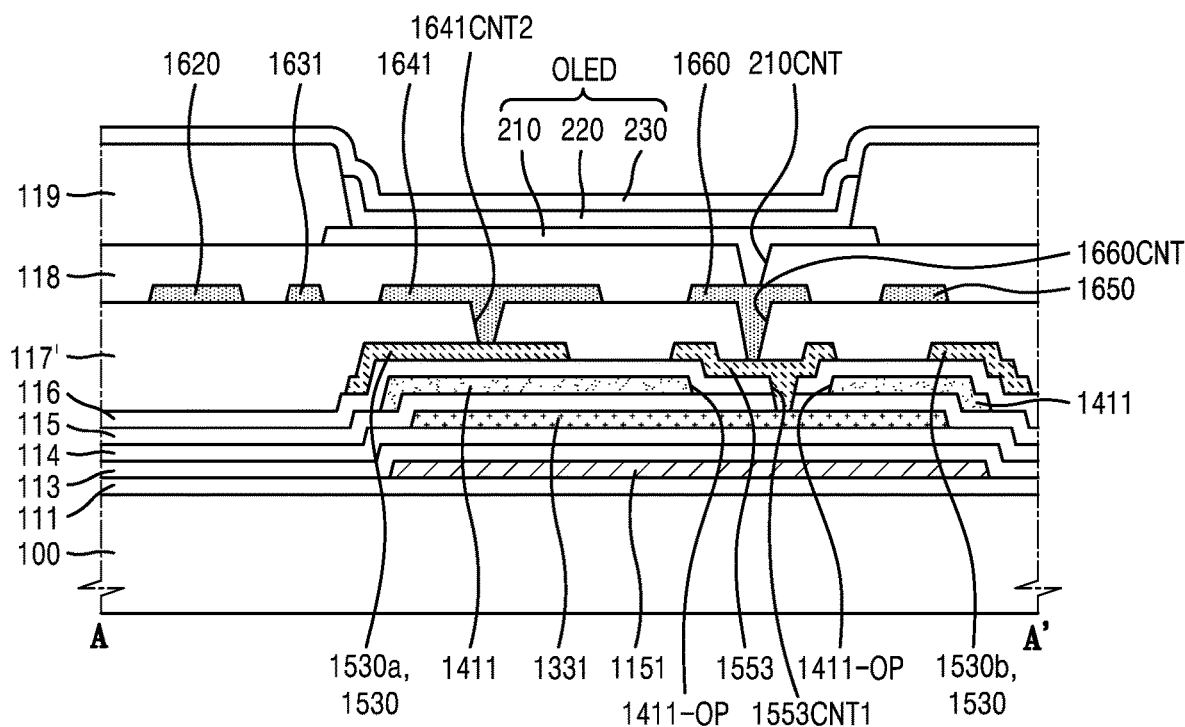
FIG. 21 is a schematic cross-sectional view schematically illustrating a cross-section taken along line A-A' of the display apparatus shown in FIG. 18.

FIG. 18 is a schematic plan view schematically illustrating positions of thin-film transistors T1 to T5, the storage capacitor Cst, and the holding capacitor Chold in the pixels included in the display apparatus of FIG. 1, and FIGS. 19 and 20 are schematic plan views schematically illustrating components, such as transistors and capacitors, of the display apparatus shown in FIG. 18, for each layer. For reference, it may be understood that the plan views shown in FIGS. 4 to 7 also show some or a number of layers of the schematic plan diagram shown in FIG. 18 in addition to the schematic plan diagrams shown in FIGS. 19 and 20. For example, FIGS. 4 to 7, and 19 and 20 may be schematic plan views schematically illustrating components such as thin-film transistors T1 to T5, the storage capacitor Cst, and the holding capacitor Chold of the display apparatus shown in FIG. 18 for each layer. FIG. 21 is a schematic cross-sectional view schematically illustrating a cross-section taken along line A-A' of the display apparatus shown in FIG. 18.

As shown in FIGS. 18, 4 to 7, and 19 and 20, the display apparatus may include pixels, and each of the pixels may include the first sub-pixel SP1, the second sub-pixel SP2, and the third sub-pixel SP3. For example, the first sub-pixel SP1 may be a red sub-pixel emitting red light, the second sub-pixel SP2 may be a green sub-pixel emitting green light, and the third sub-pixel SP3 may be a blue sub-pixel emitting blue light. However, the disclosure is not limited thereto, and one pixel may include a smaller number of sub-pixels or a larger number of sub-pixels.

The structures shown in FIGS. 18, 4 to 7, and 19 and 20 may be repeatedly arranged in the first direction (y-axis direction). However, the structures shown in FIGS. 18, 4 to 7, and 19 and 20 may be repeatedly arranged in the second direction (x-axis direction) crossing or intersecting the first direction. An area not belonging to any one sub-pixel may exist between pixels. For example, in FIG. 20, a vertical initialization voltage line 1610 and a second vertical power line 1620 are illustrated to exist between pixels adjacent to each other in the second direction (x-axis direction).

Each of the first to third sub-pixels SP1 to SP3 may include a pixel circuit. Hereinafter, for convenience of explanation, some or a number of components will be described with reference to the pixel circuit of the first sub-pixel SP1, but these components may also be arranged in the pixel circuit of each of the second sub-pixel SP2 and the third sub-pixel SP3.

A buffer layer 111 (see FIG. 21) including silicon oxide, silicon nitride, or silicon oxynitride may be disposed on the substrate 100. The first buffer layer 111 may planarize the upper surface of the substrate 100.

The lower metal layer 1100 as shown in FIG. 5 may be on the first buffer layer 111. The lower metal layer 1100 may include a first lower horizontal power line 1110, a lower write signal line 1120, a reference voltage signal line 1130, a horizontal reference voltage line 1140, a lower operation control signal line 1170, a lower initialization voltage line 1180, a lower initialization signal line 1190, a fourth capacitor electrode 1151, and a driving shield layer 1160. Among them, the first lower horizontal power line 1110, the lower write signal line 1120, the reference voltage signal line 1130, the horizontal reference voltage line 1140, the lower operation control signal line 1170, the lower initialization voltage line 1180, and the lower initialization signal line 1190 may extend in the second direction (x-axis direction).

The first lower horizontal power line 1110 may be electrically connected to the first upper horizontal power line 1510 (see FIG. 19) to be described later, through a contact hole 1510CNT (see FIG. 19). The first upper horizontal power line 1510 may be disposed above the first lower horizontal power line 1110 and extend in the second direction (x-axis direction). The first lower horizontal power line 1110 and the first upper horizontal power line 1510 may be components of the first horizontal power line.

The lower write signal line 1120 may be electrically connected to an upper write signal line 1520 (see FIG. 19) to be described later, through a contact hole 1520CNT2 (see FIG. 19). The upper write signal line 1520 may be disposed above the lower write signal line 1120 and extend in the second direction (x-axis direction).

The lower write signal line 1170 may be electrically connected to an upper operation control signal line 1570 (see FIG. 19) to be described later, through the contact hole 1570CNT1 (see FIG. 19). The upper operation control signal line 1570 may be disposed above the lower write signal line 1170 and extend in the second direction (x-axis direction).

The lower initialization voltage line 1180 may be electrically connected to an upper initialization voltage line 1580 (see FIG. 19) to be described later, through the contact hole 1580CNT1. The upper initialization voltage line 1580 may be disposed above the lower initialization voltage line 1180 and extend in the second direction (x-axis direction). The lower initialization voltage line 1180 and the upper initialization voltage line 1580 may correspond to the initialization voltage line VL of FIG. 3 together with the vertical initialization voltage line 1610 (refer to FIG. 20) to be described later.

The lower initialization signal line 1190 may be electrically connected to an upper initialization signal line 1590 (see FIG. 19) to be described later, through a contact hole 1590CNT1 (see FIG. 19). The upper initialization signal line 1590 may be disposed above the lower initialization signal line 1190 and extend in the second direction (x-axis direction).

The fourth capacitor electrode 1151 may have an isolated shape as described above. The fourth capacitor electrode 1151 is the fourth capacitor electrode CE4 of the holding capacitor Chold of FIG. 3. The fourth capacitor electrode 1151 may be electrically connected to the second horizontal power line 1530 (see FIG. 19) disposed thereon through a contact hole 1530CNT1.

The driving shield layer 1160 is electrically connected to a third capacitor electrode 1331 (see FIG. 7) through the connection electrode 1553 (see FIG. 19) to be described later. Accordingly, because a compensation voltage for compensating the threshold voltage Vth of the driving transistor T1 stored in the holding capacitor Chold is applied to the driving shield layer 1160, the driving shield layer 1160 may protect the driving active area A1 from an unintentional electrical signal from the outside.

Other descriptions of the lower metal layer 1100 are replaced with those described above with reference to FIG. 5.

The second buffer layer 113 (see FIG. 21) covers or overlaps the lower metal layer 1100 and may be disposed on the substrate 100. The second buffer layer 113 may include an insulating material. The semiconductor layer 1200 as shown in FIG. 6 may be disposed on the second buffer layer 113. The first gate insulating layer 114 (see FIG. 21) covers or overlaps the semiconductor layer 1200. The first conductive layer 1300 as shown in FIG. 7 may be disposed on the first gate insulating layer 114. The second gate insulating layer 115 (see FIG. 21) covers or overlaps the first conductive layer 1300 and may be above the substrate 100. The second conductive layer 1400 as shown in FIG. 8 may be disposed on the second gate insulating layer 115. The first interlayer insulating layer 116 (see FIG. 21) covers or overlaps the second conductive layer 1400.

The description of the second buffer layer 113, the semiconductor layer 1200, the first gate insulating layer 114, the first conductive layer 1300, the second gate insulating layer 115, the second conductive layer 1400, and the first interlayer insulating layer 116 is replaced with the above description.

The third conductive layer 1500 as shown in FIG. 19 may be on the first gate insulating layer 116. The third conductive layer 1500 may include the first upper horizontal power line 1510, the upper write signal line 1520, the second horizontal power line 1530, the upper operation control signal line 1570, the upper initialization voltage line 1580, the upper initialization signal line 1590, the first connection electrode 1541, the second connection electrode 1543, the third connection electrode 1545, the fourth connection electrode 1547, the fifth connection electrode 1551, and the sixth connection electrode 1553. Among them, the first upper horizontal power line 1510, the upper write signal line 1520, the second horizontal power line 1530, the upper operation control signal line 1570, the upper initialization voltage line 1580, and the upper initialization signal line 1590 may extend in approximately the second direction (x-axis direction). The third conductive layer 1500 may be referred to as a first source or drain layer.

The first upper horizontal power line 1510 is disposed above the first lower horizontal power line 1110. The first upper horizontal power line 1510 may be electrically connected to the first lower horizontal power line 1110 through the contact hole 1510CNT. The first upper horizontal power line 1510 and the first lower horizontal power line 1110 may be components of the first horizontal power line.

The upper write signal line 1520 is disposed above the lower write signal line 1120. The upper write signal line 1520 may be electrically connected to the lower write signal line 1120 through the contact hole 1520CNT2. The upper write signal line 1520 is connected to the switching gate electrode layer 1310 through the contact hole 1520CNT1. For example, the upper write signal line 1520 is connected to the upper switching gate electrode G2b of the switching transistor T2. A set of the upper write signal line 1520 and the lower write signal line 1120 may correspond to the write signal line GWL of FIG. 3.

The second horizontal power line 1530 may form the second power line PL2 of FIG. 3 together with the $1^{st}$-$1^{st}$ vertical power line 1641 (see FIG. 20) to be described later. For example, in the display apparatus according to the embodiment described above with reference to FIGS. 9 and 10, the second horizontal power line 1530 and the second vertical power line 1620 form the second power line PL2 of FIG. 3, but in the case of a display apparatus according to an embodiment, on the contrary, the second horizontal power line 1530 shown in FIG. 19 and the $1^{st}$-$1^{st}$ vertical power line 1641 shown in FIG. 20 are electrically connected to each other through the contact hole 1641CNT2 to form the second power line PL2. However, the second horizontal power line 1530 as shown in FIG. 19 may also be electrically connected to the $1^{st}$-$2^{nd}$ vertical power line 1642 and the first-3 vertical power line 1643 shown in FIG. 20 through the contact holes 1642CNT2 and 1643CNT2 in addition to the $1^{st}$-$1^{st}$ vertical power line 1641 shown in FIG. 20. In case that the $1^{st}$-$1^{st}$ vertical power line 1641, the $1^{st}$-$2^{nd}$ vertical power line 1642, and the first-3 vertical power line 1643 are collectively referred to as a first vertical power line, it can be said that the second horizontal power line 1530 and the first vertical power line may form the second power line PL2.

The second horizontal power line 1530 has a shape extending in the second direction (x-axis direction) and has the protrusions 1530a and 1530b protruding in the first direction (y-axis direction). The second horizontal power line 1530 is connected to the lower fourth capacitor electrode 1151 through the contact hole 1530CNT1 located in the protrusion 1530a, and is connected to one side or a side of the operation control active area A5 of the lower semiconductor layer 1200 through a contact hole 1530CNT2 located in the protrusion 1530a. For example, the second horizontal power line 1530 is electrically connected to the fourth capacitor electrodes 1151 and CE4 of the holding capacitor Chold and the operation control transistor T5.

The upper operation control signal line 1570 is disposed above the lower operation control signal line 1170. The upper operation control signal line 1570 may be connected to the lower operation control signal line 1170 through the contact hole 1570CNT1. The upper operation control signal line 1570 may be connected to the operation control gate electrode layer 1350 through a contact hole 1570CNT2. For example, the upper operation control signal line 1570 is connected to the upper operation control gate electrode G5b of the operation control transistor T5. A set of the upper operation control signal line 1570 and the lower operation control signal line 1170 may correspond to the operation control signal line EL of FIG. 3.

The upper initialization voltage line 1580 is disposed above the lower initialization voltage line 1180. The upper initialization voltage line 1580 may be connected to the lower initialization voltage line 1180 through the contact hole 1580CNT1. However, as shown in FIG. 19, the upper initialization voltage line 1580 may also be connected to the lower initialization voltage line 1180 through a contact hole 1580CNT3 located outside of the first sub-pixel SP1 to the third sub-pixel SP3. The upper initialization voltage line 1580 is connected to one side or a side of the initialization active area A4 of the semiconductor layer 1200 therebelow through a contact hole 1580CNT2. For example, the upper initialization voltage line 1580 is connected to the initialization transistor T4. The upper initialization voltage line 1580 and the lower initialization voltage line 1180 may correspond to the initialization voltage line VL of FIG. 3 together with the vertical initialization voltage line 1610 to be described later.

The upper initialization signal line 1590 is disposed above the lower initialization signal line 1190. The upper initialization signal line 1590 may be connected to the lower initialization signal line 1190 through the contact hole 1590CNT1. The upper initialization signal line 1590 may be connected to the initialization gate electrode layer 1360 through a contact hole 1590CNT2. For example, the upper initialization signal line 1590 is connected to the upper initialization gate electrode G4b of the initialization transistor T4. A set of the upper initialization signal line 1590 and the lower initialization signal line 1190 may correspond to the initialization signal line GIL of FIG. 3.

Each of the first connection electrode 1541, the second connection electrode 1543, the third connection electrode 1545, the fourth connection electrode 1547, the fifth connection electrode 1551, and the sixth connection electrode 1553 may have an isolated shape. They may be connected to other components above or below them through contact holes.

The first connection electrode 1541 is connected to one side or a side of the switching active area A2 of the semiconductor layer 1200 therebelow through a contact hole 1541CNT. The first data line 1631 on the upper portion is connected to the first connection electrode 1541 through a contact hole 1631CNT. For example, the first connection electrode 1541 electrically connects the first data line 1631 to the switching transistor T2.

The second connection electrode 1543 is connected to a portion between the switching active area A2 and the reference voltage active area A3 of the semiconductor layer 1200 through a contact hole 1543CNT1. The second connection electrode 1543 is connected to the first capacitor electrode 1411 through a contact hole 1543CNT2. As such, the second connection electrode 1543 electrically connecting the switching transistor T2, the reference voltage transistor T3, and the first capacitor electrode 1411 to each other may be understood to serve as the first node N1 of FIG. 3.

The third connection electrode 1545 is connected to the reference voltage gate layer 1320 through a contact hole 1545CNT1 and is connected to the reference voltage signal line 1130 through a contact hole 1545CNT2. For example, the third connection electrode 1545 electrically connects the gate electrode of the reference voltage transistor T3 to the reference voltage signal lines 1130 and GRL.

The fourth connection electrode 1547 is connected to one side or a side of the reference voltage active area A3 of the semiconductor layer 1200 through a contact hole 1547CNT1. The fourth connection electrode 1547 is connected to the horizontal reference voltage line 1140 through a contact hole 1547CNT2. For example, the fourth connection electrode 1547 electrically connects the reference voltage transistor T3 and the horizontal reference voltage line 1140 to each other.

The fifth connection electrode 1551 is connected to the first capacitor electrode 1411 through a contact hole 1551CNT1. The fifth connection electrode 1551 is connected to the driving gate electrode layer 1340 through a contact hole 1551CNT2. For example, the fifth connection electrode 1551 electrically connects the first capacitor electrodes 1411 and CE1 of the storage capacitor Cst to the driving gate electrode G1 of the driving transistor T1.

The sixth connection electrode 1553 is connected to the third capacitor electrode 1331 that is the second capacitor electrode CE2 of the storage capacitor Cst and the third capacitor electrode CE3 of the holding capacitor Chold through a contact hole 1553CNT1 passing through an opening 1411-OP of the first capacitor electrodes 1411 and CE1 of the storage capacitor Cst. The sixth connection electrode 1553 is connected to the driving shield layer 1160 through a contact hole 1553CNT2, and is connected to one side or a side of the driving active area A1 of the semiconductor layer 1200 through a contact hole 1553CNT3. For example, the sixth connection electrode 1553 electrically connects the second capacitor electrode CE2 of the storage capacitor Cst, the third capacitor electrode CE3 of the holding capacitor Chold, the driving shield layer 1160, and the driving transistor T1 to each other. This sixth connection electrode 1553 may be understood to serve as the second node N2 of FIG. 3.

The third conductive layer 1500 may include a metal, an alloy, a conductive metal oxide, or a transparent conductive material. For example, the third conductive layer 1500 may include Ag, alloy containing Ag, Mo, alloy containing Mo, Al, alloy containing Al, AlN, W, WN, Cu, Ni, Cr, CrN, Ti, Ta, Pt, Sc, ITO, or IZO. For example, the third conductive layer 1500 may have a multilayer structure including about a 700 Å-thick titanium layer, about a 6000 Å-thick aluminum layer, and about a 300 Å-thick titanium layer.

A second interlayer insulating layer 117' (see FIG. 21) covers or overlaps the third conductive layer 1500 and may be disposed on the first interlayer insulating layer 116. Unlike the second interlayer insulating layer 117 included in the display apparatus according to the embodiment described above with reference to FIG. 11, the second interlayer insulating layer 117' may include an organic insulating material. For example, the second interlayer insulating layer 117' may include photoresist, BCB, polyimide, HMDSO, PMMA, polystyrene, a polymer derivative having a phenol-based group, an acrylic polymer, an imide polymer, an aryl ether polymer, an amide polymer, a fluorine polymer, a p-xylene polymer, a vinyl alcohol-based polymer, or a mixture thereof. For example, the second interlayer insulating layer 117' may include a polyimide layer having a thickness of approximately 1.6 μm.

The fourth conductive layer 1600 as shown in FIG. 20 may be on the second interlayer insulating layer 117'. The fourth conductive layer 1600 may include the first data line 1631, the $1^{st}$-$1^{st}$ vertical power line 1641, the vertical reference voltage line 1650, and a seventh connection electrode 1660 passing through a sub-pixel area. The fourth conductive layer 1600 may include the vertical initialization voltage line 1610 and the second vertical power line 1620 passing between pixels including the first sub-pixel SP1 to the third sub-pixel SP3. Each of the first data line 1631, the $1^{st}$-$1^{st}$ vertical power line 1641, the vertical reference voltage line 1650, the vertical initialization voltage line 1610, and the second vertical power line 1620 may have a shape extending approximately in the first direction (y-axis direction).

The first data line 1631 is connected to the lower first connection electrode 1541 through the contact hole 1631CNT, and as a result, is electrically connected to the switching transistor T2. For example, the first data line 1631 is connected to the lower first connection electrode 1541 through the contact hole 1631CNT, and is electrically connected to one side or a side of the switching active area A2 of the semiconductor layer 1200. The $1^{st}$-$1^{st}$ vertical power line 1641 is connected to the first upper horizontal power line 1530 through the contact hole 1641CNT1. The $1^{st}$-$1^{st}$ vertical power line 1641 may form the second power line PL2 of FIG. 3 together with the second horizontal power line 1530. The vertical reference voltage line 1650 is connected to the fourth connection electrode 1547 through the contact hole 1650CNT. As described above, the fourth connection electrode 1547 electrically connects the reference voltage transistor T3 to the horizontal reference voltage line 1140. As a result, the vertical reference voltage line 1650 is electrically connected to the horizontal reference voltage line 1140 and corresponds to the reference voltage line RL of FIG. 3.

The isolated seventh connection electrode 1660 is connected to the sixth connection electrode 1553 through a contact hole 1660CNT. As described above, the sixth connection electrode 1553 electrically connects the second capacitor electrode CE2 of the storage capacitor Cst, the third capacitor electrode CE3 of the holding capacitor Chold, the driving shield layer 1160, and the driving transistor T1 to each other. Accordingly, the seventh connection electrode 1660 may also be electrically connected to such components. The pixel electrode 210 disposed above the seventh connection electrode 1660 is connected to the seventh connection electrode 1660 through a contact hole 210CNT. Accordingly, the seventh connection electrode 1660 may be understood to serve as the second node N2 together with the sixth connection electrode 1553.

The vertical initialization voltage line 1610 is connected to the upper initialization voltage line 1580 through a contact hole 1610CNT. Accordingly, the vertical initialization voltage line 1610, along with the upper initialization voltage line 1580 and the lower initialization voltage line 1180 electrically connected to each other, may correspond to the initialization voltage line VL of FIG. 3.

The second vertical power line 1620 is connected to the second horizontal power line 1510 through the contact hole 1620CNT. Because a set of the first lower horizontal power line 1110 and the first upper horizontal power line 1510 electrically connected to each other as described above may be referred to as a first horizontal power line, the 12 vertical power line 1620 may form a first power line together with the first horizontal power line.

The fourth conductive layer 1600 may include a metal, an alloy, a conductive metal oxide, or a transparent conductive material. For example, the fourth conductive layer 1600 may include Ag, alloy containing Ag, Mo, alloy containing Mo, Al, alloy containing Al, AlN, W, WN, Cu, Ni, Cr, CrN, Ti, Ta, Pt, Sc, ITO, or IZO. For example, the fourth conductive layer 1600 may have a multilayer structure including about a 700 Å-thick titanium layer, about a 6000 Å-thick aluminum layer, and about a 300 Å-thick titanium layer. The fourth conductive layer 1600 may be referred to as a second source or drain layer.

The planarization layer 118 may cover or overlap the fourth conductive layer 1600 and may be disposed on the second interlayer insulating layer 117'. The planarization layer 118 may include an organic insulating material. For example, the planarization layer 118 may include photoresist, BCB, polyimide, HMDSO, PMMA, polystyrene, a polymer derivative having a phenol-based group, an acrylic polymer, an imide polymer, an aryl ether polymer, an amide polymer, a fluorine polymer, a p-xylene polymer, a vinyl alcohol-based polymer, or a mixture thereof. For example, the planarization layer 118 may include a polyimide layer having a thickness of approximately 1.6 μm.

The organic light-emitting diode OLED may be disposed on the planarization layer 118. The organic light-emitting diode OLED may include the pixel electrode 210, an intermediate layer 220 including an emission layer, and the opposite electrode 230. The pixel defining layer 119 may be disposed on the planarization layer 118. For the organic light-emitting diode OLED and the pixel defining layer 119, the description in the above-described embodiment may be applied.

The configuration of the first sub-pixel SP1 has been described, but this description may also be applied to the second sub-pixel SP2 and/or the third sub-pixel SP3.

For reference, in FIGS. 5 to 20, the fourth capacitor electrode 1151, the third capacitor electrode 1331, the first capacitor electrode 1411, the first data line 1631, and the $1^{st}$-$1^{st}$ vertical power line 1641 are illustrated as being located in the first sub-pixel SP1 or passing through the first sub-pixel SP1, and for convenience, reference numerals are distinguished from them to show that the fourth capacitor electrode 1152, the third capacitor electrode 1332, the first capacitor electrode 1412, the second data line 1632, and the $1^{st}$-$2^{nd}$ vertical power line 1642 are located in the second sub-pixel SP2 or passing through the second sub-pixel SP2. The fourth capacitor electrode 1153, a third capacitor electrode 1333, the first capacitor electrode 1413, the third data line 1633, and the first-3 vertical power line 1643 are illustrated as being located in the third sub-pixel SP3 or passing through the third sub-pixel SP3 by using the reference numerals distinguished therefrom. Because the pixel electrode 210 is located in each of the first sub-pixel SP1 to the third sub-pixel SP3, the pixel electrode 210 located in the third sub-pixel SP3 may be referred to as a third pixel electrode, the pixel electrode 210 located in the first sub-pixel SP1 may be referred to as a first pixel electrode, and the pixel electrode 210 located in the second sub-pixel SP2 may be referred to as a second pixel electrode.

The second data line 1632 is electrically connected to the corresponding first connection electrode 1541 under or below the second data line 1632 through a contact hole 1632CNT, and the third data line 1633 is electrically connected to the corresponding first connection electrode 1541 under or below the third data line 1633 through a contact hole 1633CNT and is electrically connected to corresponding portions of the semiconductor layer 1200.

In the display apparatus according to an embodiment as described above, a set of the lower write signal line 1120 of the lower metal layer 1100 and the upper write signal line 1520 of the third conductive layer 1500 electrically connected to each other forms the write signal line GWL of FIG. 3. Because the write signal line GWL has a two-layer structure as described above, a voltage drop due to resistance in the write signal line GWL may be minimized.

It may be considered that the write signal line GWL has a one-layer structure instead of such a two-layer structure. However, a scan driving circuit electrically connected to the write signal line GWL and located in the first peripheral area PA1 and/or the second peripheral area PA2 outside the display area DA increases in size, a problem in that the area PA1 and/or the second peripheral area PA2 increases may occur.

Because the display apparatus according to an embodiment comprises the write signal line GWL including the lower write signal line 1120 of the lower metal layer 1100 and the upper write signal line 1520 of the third conductive layer 1500 electrically connected each other, a voltage drop in the write signal line GWL may be reduced, and accordingly, the size of the scan driving circuit may be reduced, and thus the area of the first peripheral area PA1 and/or the second peripheral area PA2. Accordingly, the area of the peripheral area PA, which is a non-display area outside the display area DA, may be minimized. For example, in the case of the display apparatus according to an embodiment, a length of the display area DA in the second direction (x-axis direction), which is the horizontal direction in which the lower write signal line 1120 and the upper write signal line 1520 extend, is greater than a length of the display area DA in the first direction (y-axis direction), which is the vertical direction. Accordingly, because the write signal line GWL extending in the long horizontal second direction (x-axis direction) has a two-layer structure of the lower write signal line 1120 and the upper write signal line 1520, a voltage drop thereof may be effectively reduced and the area of the first peripheral area PA1 and the second peripheral area PA2 may be effectively reduced.

On the other hand, as described above, the second interlayer insulating layer 117', which may be referred to as a planarization layer including an organic insulating material, is interposed between the third conductive layer 1500 and the fourth conductive layer 1600. Because a dielectric constant of the organic insulating material is less than that of an inorganic insulating material, a parasitic capacitance between the third conductive layer 1500 and the fourth conductive layer 1600 may be reduced.

For example, the first upper horizontal power line 1510, the upper write signal line 1520, the upper operation control signal line 1570, the upper initialization voltage line 1580, and the upper initialization signal line 1590 cross the $1^{st}$-$1^{st}$ vertical power line 1641. Accordingly, a parasitic capacitance may be between the first upper horizontal power line 1510, the upper write signal line 1520, the upper operation control signal line 1570, the upper initialization voltage line 1580, and the upper initialization signal line 1590 and the $1^{st}$-1st vertical power line 1641. However, in the case of the display apparatus according to an embodiment, because the second interlayer insulating layer 117' is interposed between the third conductive layer 1500 and the fourth conductive layer 1600, which is a planarization layer including the organic insulating material having a low dielectric constant rather than the inorganic insulating material having a high dielectric constant, the size of the parasitic capacitance can be drastically reduced. For example, by forming the second interlayer insulating layer 117' to be thick, the size of the parasitic capacitance may be further remarkably reduced.

On the other hand, the second buffer layer 113 containing an inorganic insulating material and the first gate insulating layer 114 is interposed between the fourth capacitor electrode 1151 included in the lower metal layer 1100 and the third capacitor electrode 1331 included in the first conductive layer 1300, and the second gate insulating layer 115 including an inorganic insulating material may be arranged between the third capacitor electrode 1331 included in the first conductive layer 1300 and the first capacitor electrode 1411 included in the second conductive layer 1400. Because the inorganic insulating material has a high dielectric constant, the capacitance of the holding capacitor Chold including the fourth capacitor electrode 1151 and the third capacitor electrode 1331, and the capacitance of the storage capacitor Cst including the third capacitor electrode 1331 and the first capacitor electrode 1411 as a second capacitor electrode may be increased.

As the capacitance of the holding capacitor Chold increases, a data swing range, which is a range of data voltages required to implement a gray scale range that can be expressed by the display apparatus, may be reduced. This is because a reflection rate of an emission current of the data voltage according to a data signal is proportional to the capacitance of the holding capacitor Chold. In case that the data swing range is large, a defect in displaying a black image instead of a normal image may occur momentarily. This is because an available data voltage range in a data driving circuit is limited. The display apparatus according to an embodiment may implement a display apparatus displaying a high-quality image by effectively preventing such a defect from occurring by allowing the storage capacitor Chold to have a large capacitance.

On the other hand, in the case of the display apparatus according to an embodiment, the second vertical power line 1620 extends in the first direction (y-axis direction). The first lower horizontal power line 1110 and the first upper horizontal power line 1510 electrically connected to each other to form the first horizontal power line extend in the second direction (x-axis direction). The first horizontal power line is disposed on a layer different from a layer on which the second vertical power line 1620, but is electrically connected to the second vertical power line 1620. Because each of the first horizontal power lines has a two-layer structure of the first lower horizontal power line 1110 and the first upper horizontal power line 1510, the resistance thereof may be dramatically reduced. Accordingly, the potential of a second vertical power line and a first horizontal power line may be kept constant by minimizing an IR-drop in the entire display area DA (see FIG. 17).

For example, in the case of the display apparatus according to an embodiment, a length of the display area DA in the second direction (x-axis direction), which is the horizontal direction in which the first lower horizontal power line 1110 and the first upper horizontal power line 1510 extend, is greater than a length of the display area DA in the first direction (y-axis direction), which is the vertical direction. Accordingly, because a first horizontal power line extending in the second long horizontal direction (x-axis direction) has a two-layer structure of the first lower horizontal power line 1110 and the first upper horizontal power line 1510, a voltage drop thereof may be effectively reduced.

The opposite electrode 230 of the organic light-emitting diode OLED is electrically connected to the second vertical power lines and the first horizontal power lines outside the display area DA. However, as described above, a first power supply wiring having a loop shape with one side open or a side open may be electrically connected to the second vertical power lines and the first horizontal power lines, and the opposite electrode 230 may be electrically connected to the first power supply wiring. Through the second vertical power lines and the first horizontal power lines as described above, a deviation in the first power voltage ELVSS applied to the opposite electrode 230 in sub-pixels in the display area DA may be prevented or minimized.

As described above, the driving transistor T1 or the like may be an NMOS thin-film transistor because it may include an oxide semiconductor material. The luminance of the organic light-emitting diode OLED is determined according to a potential difference between the driving gate electrode G1 of the driving transistor T1 and the second node N2 serving as a source area. Therefore, a first power voltage, which affects the potential of the second node N2, has no deviation or needs to be minimized in the sub-pixels. Otherwise, even if the data signal DT for emitting light with a same luminance is applied to sub-pixels, the sub-pixels emit light with different luminance, which ultimately leads to deterioration of a displayed image.

However, as described above, the display apparatus according to an embodiment may prevent or minimize the occurrence of a deviation in the first power voltage ELVSS applied to the opposite electrode 230 in the sub-pixels in the display area DA. Accordingly, a display apparatus that displays a high-quality image may be implemented.

The discussion related to minimizing a voltage drop in the long second direction (x-axis direction) as described above may also be applied to the lower operation control signal line 1170 and the upper operation control signal line 1570 that are electrically connected to each other, may also be applied to the lower initialization voltage line 1180 and the upper initialization voltage line 1580 that are electrically connected to each other, and may also be applied to the lower initialization signal line 1190 and the upper initialization signal line 1590 electrically connected to each other.

On the other hand, as shown in FIG. 19, the second horizontal power line 1530 has a shape extending in the second direction (x-axis direction) and has the portions 1530a and 1530b protruding in the first direction (y-axis direction). As can be seen in FIG. 21, which is a schematic cross-sectional view, the protrusion 1530a is interposed between the first data line 1631 of the first subpixel SP1 and the first capacitor electrode 1411 of the first subpixel SP1. Similarly, the protrusion 1530b is interposed between the second data line 1632 of the second subpixel SP2 and the first capacitor electrode 1411 of the first sub-pixel.

As described above, because the first capacitor electrode 1411 is electrically connected to the driving gate electrode G1 of the driving transistor T1, the first capacitor electrode 1411 plays an important role in determining the amount of current flowing through the organic light-emitting diode OLED. The protrusion 1530a is interposed between the first data line 1631 of the first subpixel SP1 and the first capacitor electrode 1411 of the first subpixel SP1, and prevents or minimizes the influence of the potential of the first capacitor electrode 1411 of the first sub-pixel SP1 by the first data line 1631 of the first sub-pixel SP1. The protrusion 1530b is interposed between the second data line 1632 of the second subpixel SP2 and the first capacitor electrode 1411 of the first subpixel, and may prevent or minimize the influence of the first capacitor electrode 1411 of the first sub-pixel by the second data line 1632 of the second sub-pixel SP2. For example, because the second horizontal power line 1530 maintains a constant second power voltage ELVDD, electromagnetic shielding of the first capacitor electrode 1411 may be ensured. The same applies to the first capacitor electrode 1412 of the second sub-pixel SP2 and the first capacitor electrode 1413 of the third sub-pixel SP3.

On the other hand, the second power line PL2 is formed by the $1^{st}$-$1^{st}$ vertical power line 1641 and the second horizontal power line 1530 electrically connected to each other. In the display area DA, because $1^{st}$-$1^{st}$ vertical power lines 1641 and second horizontal power lines 1530 have a mesh-like shape, a voltage drop on the second power line PL2 is minimized and the constant second power voltage ELVDD is applied to each sub-pixel in the display area DA. However, if necessary, the $1^{st}$-$1^{st}$ vertical power lines 1641, the $1^{st}$-$2^{nd}$ vertical power lines 1642, the first-3 vertical power lines 1643, and the second horizontal power lines 1530 may have a mesh-like shape.

Similarly, the reference voltage line RL is formed by the vertical reference voltage line 1650 and the horizontal reference voltage line 1140 electrically connected to each other. In the display area DA, because the vertical reference voltage lines 1650 and the horizontal reference voltage lines 1140 have a mesh-like shape, a voltage drop on the reference voltage line RL is minimized and the constant reference voltage Vref is applied to each sub-pixel in the display area DA.

According to an embodiment as described above, a display apparatus in which a high-quality image is displayed, may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first sub-pixel including a first pixel electrode;
   a second sub-pixel including a second pixel electrode;
   a 1st-$1^{st}$ vertical power line extending in a first direction and passing through the first sub-pixel;
   a $1^{st}$-$2^{nd}$ vertical power line extending in the first direction and passing through the second sub-pixel;
   a first horizontal power line, wherein the first horizontal power line is disposed on a layer different from a layer on which the $1^{st}$-$1^{st}$ vertical power line and the $1^{st}$-$2^{nd}$ vertical power line are disposed, the first horizontal power line extends in a second direction intersecting the first direction, and the first horizontal power line is electrically connected to the $1^{st}$-$1^{st}$ vertical power line and the $1^{st}$-$2^{nd}$ vertical power line; and
   an opposite electrode disposed above the first pixel electrode and the second pixel electrode, wherein the opposite electrode is integral as a single body over the first sub-pixel and the second sub-pixel, and is electrically connected to the $1^{st}$-$1^{st}$ vertical power line and the 1st-$2^{nd}$ vertical power line.

2. The display apparatus of claim 1, wherein the opposite electrode is electrically connected to the $1^{st}$-$1^{st}$ vertical power line and the $1^{st}$-$2^{nd}$ vertical power line outside of a display area including the first sub-pixel and the second sub-pixel.

3. The display apparatus of claim 1, wherein the $1^{st}$-$1^{st}$ vertical power line and the $1^{st}$-$2^{nd}$ vertical power line are disposed on an insulating layer covering the first horizontal power line.

4. The display apparatus of claim 3, wherein
the $1^{st}$-$1^{st}$ vertical power line is electrically connected to the first horizontal power line through a contact hole in the first sub-pixel, and
the $1^{st}$-$2^{nd}$ vertical power line is electrically connected to the first horizontal power line through a contact hole in the second sub-pixel.

5. The display apparatus of claim 3, wherein the first horizontal power line comprises:
a first lower horizontal power line extending in the second direction; and
a first upper horizontal power line disposed above the first lower horizontal power line and electrically connected to the first lower horizontal power line.

6. The display apparatus of claim 5, further comprising:
a semiconductor layer disposed on an insulating layer covering the first lower horizontal power line,
wherein the first upper horizontal power line is disposed on an insulating layer covering the semiconductor layer.

7. The display apparatus of claim 6, wherein the semiconductor layer includes an oxide semiconductor material.

8. The display apparatus of claim 6, wherein the semiconductor layer is an n-type semiconductor layer.

9. The display apparatus of claim 1, further comprising:
a second vertical power line disposed outside of the first sub-pixel and the second sub-pixel and extending in the first direction; and
a second horizontal power line extending in the second direction and passing through the first sub-pixel and the second sub-pixel and electrically connected to the second vertical power line.

10. The display apparatus of claim 9, wherein the second horizontal power line is electrically connected to a transistor included in the first sub-pixel and a transistor included in the second sub-pixel.

11. The display apparatus of claim 9, wherein the second vertical power line, the $1^{st}$-$1^{st}$ vertical power line, and the $1^{st}$-$2^{nd}$ vertical power line are disposed on a same layer.

12. The display apparatus of claim 9, wherein the first horizontal power line comprises:
a first lower horizontal power line extending in the second direction; and
a first upper horizontal power line disposed above the first lower horizontal power line and electrically connected to the first lower horizontal power line,
wherein the second horizontal power line and the first upper horizontal power line are disposed on a same layer.

13. The display apparatus of claim 12, further comprising:
a semiconductor layer including an oxide semiconductor material, the semiconductor layer being disposed on an insulating layer covering the first lower horizontal power line,
wherein the second horizontal power line and the first upper horizontal power line are disposed on an insulating layer covering the semiconductor layer.

14. The display apparatus of claim 9, wherein the first horizontal power line comprises:
a first lower horizontal power line extending in the second direction; and
a first upper horizontal power line disposed above the first lower horizontal power line and electrically connected to the first lower horizontal power line,
wherein the second horizontal power line and the first lower horizontal power line are disposed on a same layer.

15. The display apparatus of claim 14, further comprising:
a semiconductor layer including an oxide semiconductor material, the semiconductor layer being disposed on an insulating layer covering the second horizontal power line and the first lower horizontal power line, wherein the first upper horizontal power line is disposed on an insulating layer covering the semiconductor layer.

16. The display apparatus of claim 15, further comprising:
a semiconductor layer including an oxide semiconductor material, the semiconductor layer being disposed on an insulating layer covering the second horizontal power line and the first lower horizontal power line; and
upper capacitor electrodes disposed on an insulating layer covering the semiconductor layer, the upper capacitor electrodes overlapping a lower capacitor electrode in a plan view disposed in the first sub-pixel and a lower capacitor electrode disposed in the second sub-pixel,
wherein the first upper horizontal power line is disposed on an insulating layer covering the upper capacitor electrodes.

17. The display apparatus of claim 15, further comprising:
a semiconductor layer including an oxide semiconductor material, the semiconductor layer being disposed on an insulating layer covering the second horizontal power line and the first lower horizontal power line;
upper capacitor electrodes disposed on an insulating layer covering the semiconductor layer, the upper capacitor electrodes overlapping a lower capacitor electrode in a plan view disposed in the first sub-pixel and a lower capacitor electrode disposed in the second sub-pixel; and
additional capacitor electrodes overlapping the upper capacitor electrodes in a plan view, and being disposed on an insulating layer covering the upper capacitor electrodes,
wherein the first upper horizontal power line is disposed on an insulating layer covering the additional capacitor electrodes.

18. The display apparatus of claim 14, wherein the second horizontal power line, a lower capacitor electrode disposed in the first sub-pixel, and a lower capacitor electrode disposed in the second sub-pixel are integral with each other as a single body.

19. The display apparatus of claim 14, further comprising:
a first shield layer and a second shield layer, the first shield layer, the second shield layer, and the first upper horizontal power line being disposed on a same layer, the first shield layer being disposed in the first sub-pixel and the second shield layer being disposed in the second sub-pixel, wherein
the $1^{st}$-$1^{st}$ vertical power line, the $1^{st}$-$2^{nd}$ vertical power line, and the second vertical power line are disposed on an insulating layer covering the first shield layer and the second shield layer, and the $1^{st}$-$1^{st}$ vertical power line is electrically connected to the first shield layer through a contact hole and the $1^{st}$-$2^{nd}$ vertical power line is electrically connected to the second shield layer through a contact hole.

20. The display apparatus of claim 19, further comprising:
a first upper capacitor electrode disposed in the first sub-pixel, and a second upper capacitor electrode disposed in the second sub-pixel;
a first additional capacitor electrode and a second additional capacitor electrode disposed on an insulating layer covering the first upper capacitor electrode and the second upper capacitor electrode, the first additional capacitor electrode overlapping the first upper capacitor electrode in a plan view, the second additional capacitor electrode overlapping the second upper capacitor electrode in a plan view;
a first data line extending in the first direction and passing through the first sub-pixel; and
a second data line extending in the first direction and passing through the second sub-pixel, wherein
the first shield layer and the second shield layer are disposed on an insulating layer covering the first additional capacitor electrode and the second additional capacitor electrode, the first data line and the second data line are disposed on an insulating layer covering the first shield layer and the second shield layer,
the first shield layer is disposed between the first additional capacitor electrode and the first data line, and
the second shield layer is disposed between the second additional capacitor electrode and the second data line.

21. The display apparatus of claim 1, wherein the first horizontal power line is electrically connected to the $1^{st}$-$1^{st}$ vertical power line via a first contact hole defined in the first sub-pixel, and the first horizontal power line is electrically connected to the $1^{st}$-$2^{nd}$ vertical power line via a second contact defined in the second sub-pixel.

22. The display apparatus of claim 1, wherein the first horizontal power line extends continuously between the first sub-pixel and the second sub-pixel.

* * * * *